(12) United States Patent
Fujimoto et al.

(10) Patent No.: US 8,680,549 B2
(45) Date of Patent: Mar. 25, 2014

(54) SEMICONDUCTOR LIGHT-EMITTING DEVICE AND LIGHTING INSTRUMENT EMPLOYING THE SAME

(75) Inventors: Akira Fujimoto, Kawasaki (JP); Ryota Kitagawa, Tokyo (JP); Eishi Tsutsumi, Kawasaki (JP); Koji Asakawa, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 622 days.

(21) Appl. No.: 12/876,318

(22) Filed: Sep. 7, 2010

(65) Prior Publication Data

US 2011/0220936 A1   Sep. 15, 2011

(30) Foreign Application Priority Data

Mar. 10, 2010 (JP) .................................. 2010-52809

(51) Int. Cl.
*H01L 33/40* (2010.01)

(52) U.S. Cl.
USPC ...................................... 257/98; 257/E33.07

(58) Field of Classification Search
USPC ................... 257/98, 99, 78, E33.07, E21.159
See application file for complete search history.

(56) References Cited

U.S. PATENT DOCUMENTS

| | | | |
|---|---|---|---|
| 6,903,374 B2 | 6/2005 | Katayama | |
| 2005/0067625 A1* | 3/2005 | Hata | 257/81 |
| 2008/0296602 A1* | 12/2008 | Liu | 257/99 |
| 2011/0049556 A1 | 3/2011 | Fujimoto | |

FOREIGN PATENT DOCUMENTS

| | | |
|---|---|---|
| JP | 2001-148511 | 5/2001 |
| JP | 2002-16286 | 1/2002 |
| JP | 2004-363572 | 12/2004 |
| JP | 2007-165613 | 6/2007 |
| JP | 2007-220972 | 8/2007 |
| JP | 2007-288002 | 11/2007 |
| JP | 2009-76361 | 4/2009 |
| JP | 2009-94219 | 4/2009 |
| JP | 2009-231689 | 10/2009 |
| KR | 10-2005-0072640 | 7/2005 |
| KR | 10-0579320 | 5/2006 |
| WO | WO 03/065464 A1 | 8/2003 |
| WO | WO 2006/082687 A1 | 8/2006 |

OTHER PUBLICATIONS

Masunaga, U.S. Appl. No. 13/038,154, filed Mar. 1, 2011.
Kitagawa, U.S. Appl. No. 13/037,864, filed Mar. 1, 2011.
Asakawa, U.S. Appl. No. 13/037,990, filed Mar. 1, 2011.
Kitagawa, U.S. Appl. No. 13/037,914, filed Mar. 1, 2011.
Fujimoto, U.S. Appl. No. 13/037,937, filed Mar. 1, 2011.

(Continued)

*Primary Examiner* — Selim Ahmed
(74) *Attorney, Agent, or Firm* — Finnegan, Henderson, Farabow, Garrett & Dunner, L.L.P.

(57) ABSTRACT

A semiconductor light-emitting device according to the embodiment includes a substrate, a compound semiconductor layer, a metal electrode layer provided with particular openings, a light-extraction layer, and a counter electrode. The light-extraction layer has a thickness of 20 to 120 nm and covers at least partly the metal part of the metal electrode layer; or otherwise the light-extraction layer has a rugged structure and covers at least partly the metal part of the metal electrode layer. The rugged structure has projections so arranged that their summits are positioned at intervals of 100 to 600 nm, and the heights of the summits from the surface of the metal electrode layer are 200 to 700 nm.

8 Claims, 15 Drawing Sheets

(56) References Cited

OTHER PUBLICATIONS

Yamada et al., "InGaN-Based Near-Ultraviolet and Blue-Light-Emitting-Diodes with High External Quantum Efficiency Using a Patterned Sapphire Substrate and a Mesh Electrode," Jpn. J. Appl. Phys. (Dec. 15, 2002), 41:L1431-L1433.

Notice of Final Rejection issued by the Korean Intellectual Property Office on Feb. 6, 2013, for Korean Patent Application No. 10-2010-92875, and English-language translation thereof.

Notification of Reasons for Rejection issued by the Japanese Patent Office on Feb. 14, 2012, for Japanese Patent Application No. 2010-052809, and English-language translation thereof.

Notification of the First Office Action, issued by the Chinese Patent Office, dated Mar. 20, 2013, in counterpart Chinese Patent Application No. 201010520326.9 (15 pages including translation).

Notice of Preliminary Rejection issued by the Korean Intellectual Property Office on Jul. 30, 2012, for Korean Patent Application No. 10-2010-92875, and English-language translation thereof.

Notification of Reason for Rejection issued by the Japanese Patent Office on Sep. 28, 2012, for Japanese Patent Application No. 2010-052809, and English-language translation thereof.

Notice of Preliminary Rejection issued by the Korean Intellectual Property Office on May 20, 2013, for Korean Patent Application No. 10-2013-25061, and English-language translation thereof.

Notice of Preliminary Rejection issued by the Korean Intellectual Property Office on Dec. 9, 2011, for Korean Patent Application No. 10-2010-92875, and English-language translation thereof.

\* cited by examiner

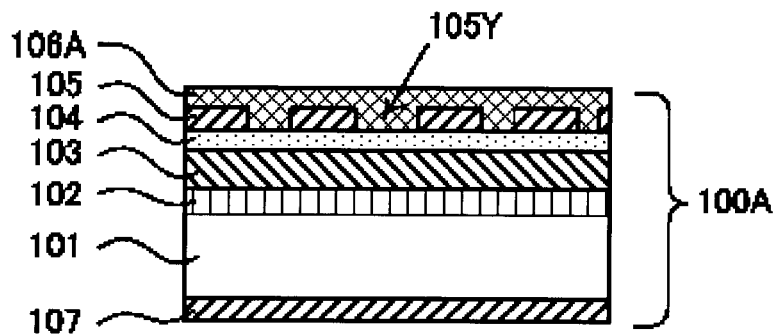
F I G. 1A
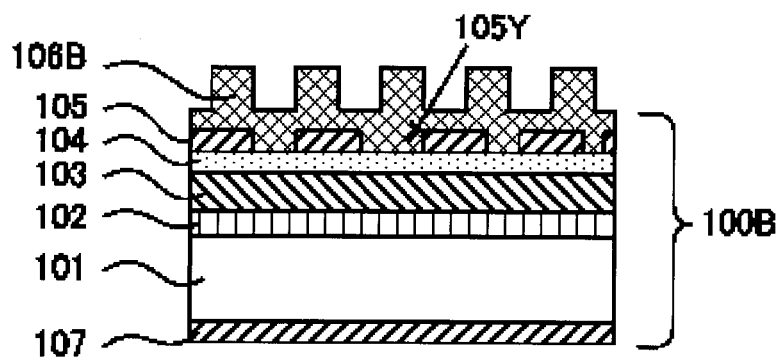
F I G. 1B
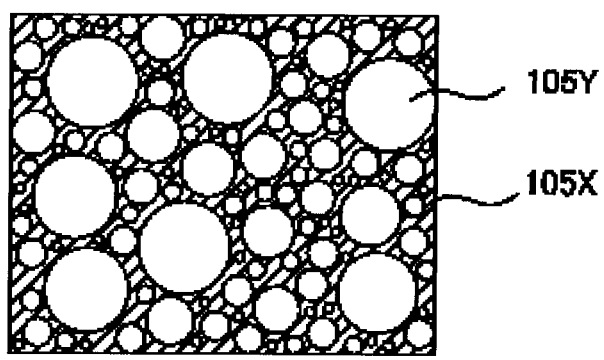
F I G. 1C

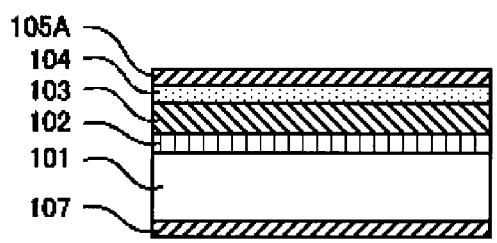
F I G. 2A
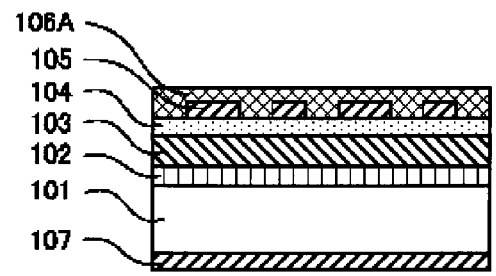
F I G. 2D
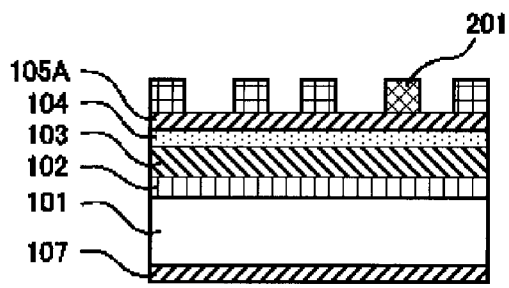
F I G. 2B
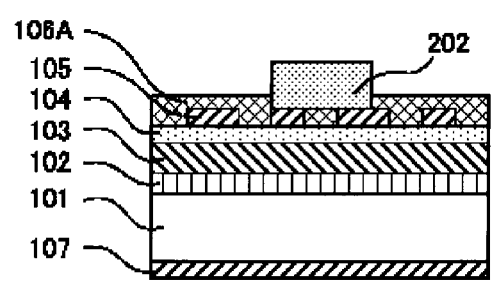
F I G. 2E
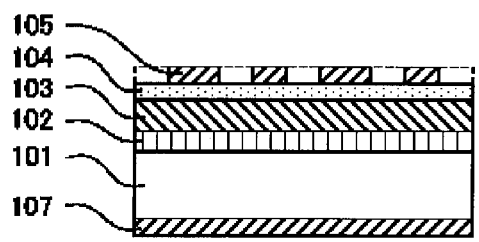
F I G. 2C

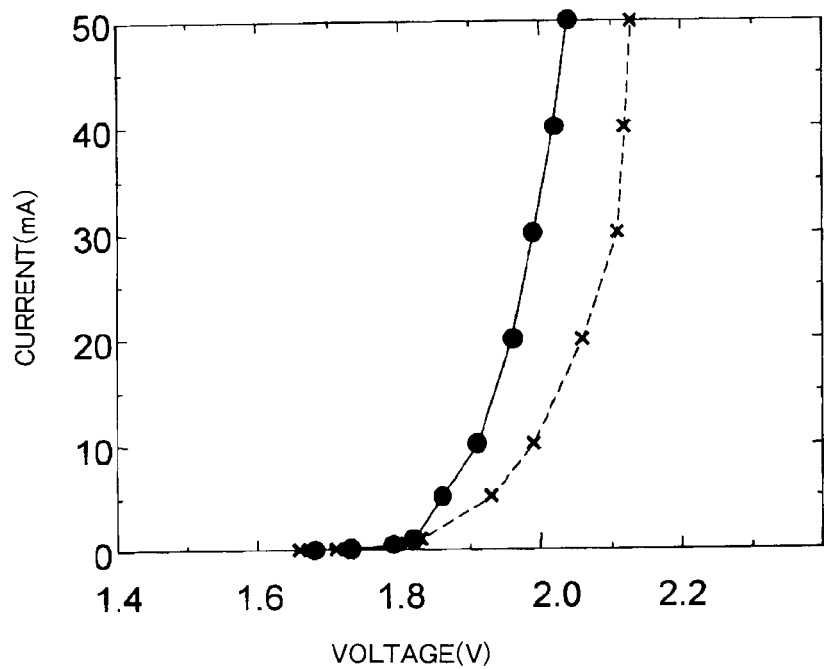
F I G. 3A
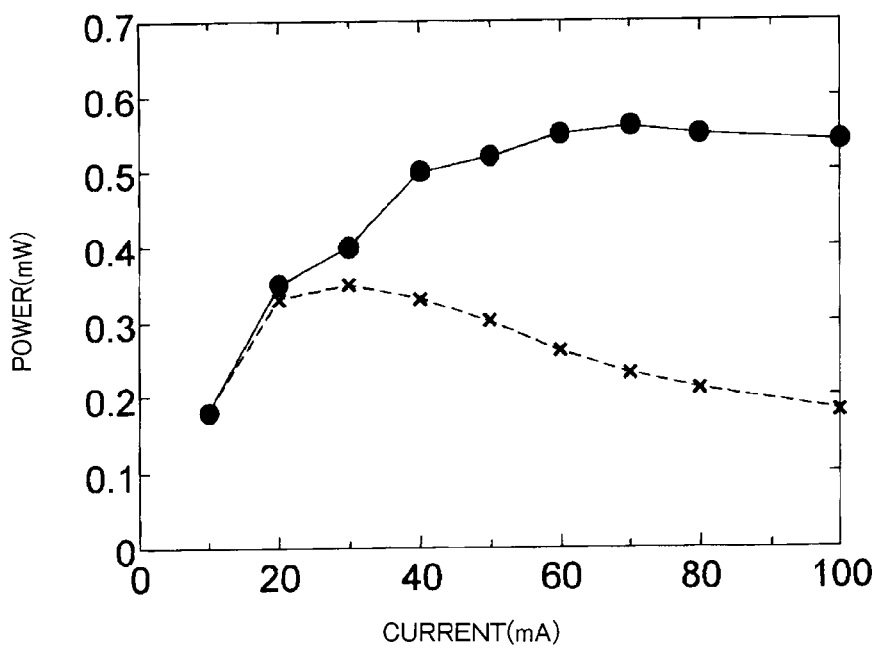
F I G. 3B

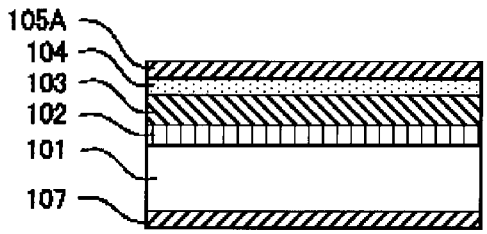
F I G. 4A
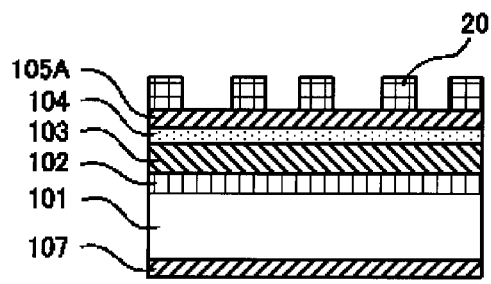
F I G. 4B
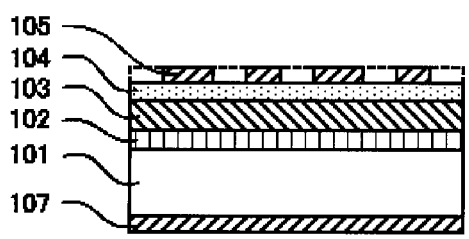
F I G. 4C
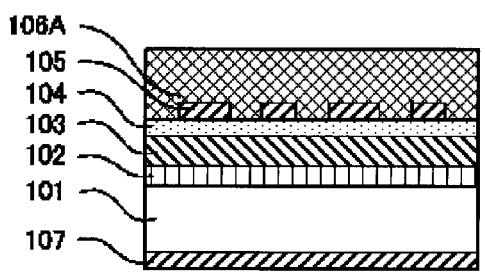
F I G. 4D
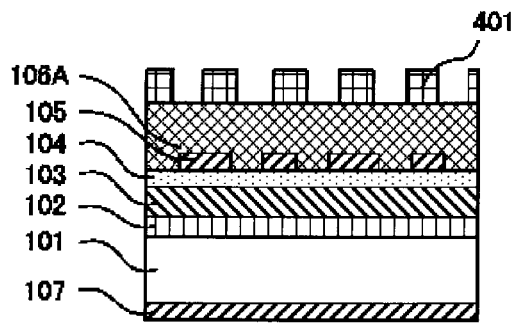
F I G. 4E
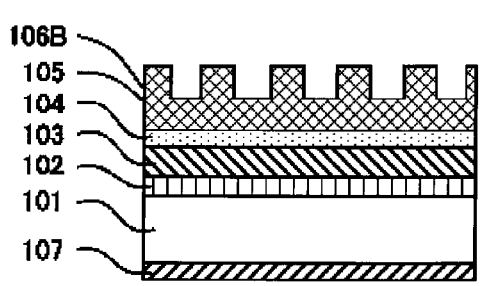
F I G. 4F
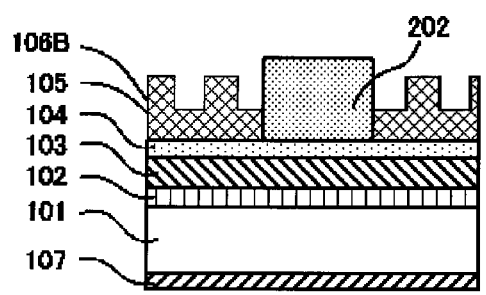
F I G. 4G

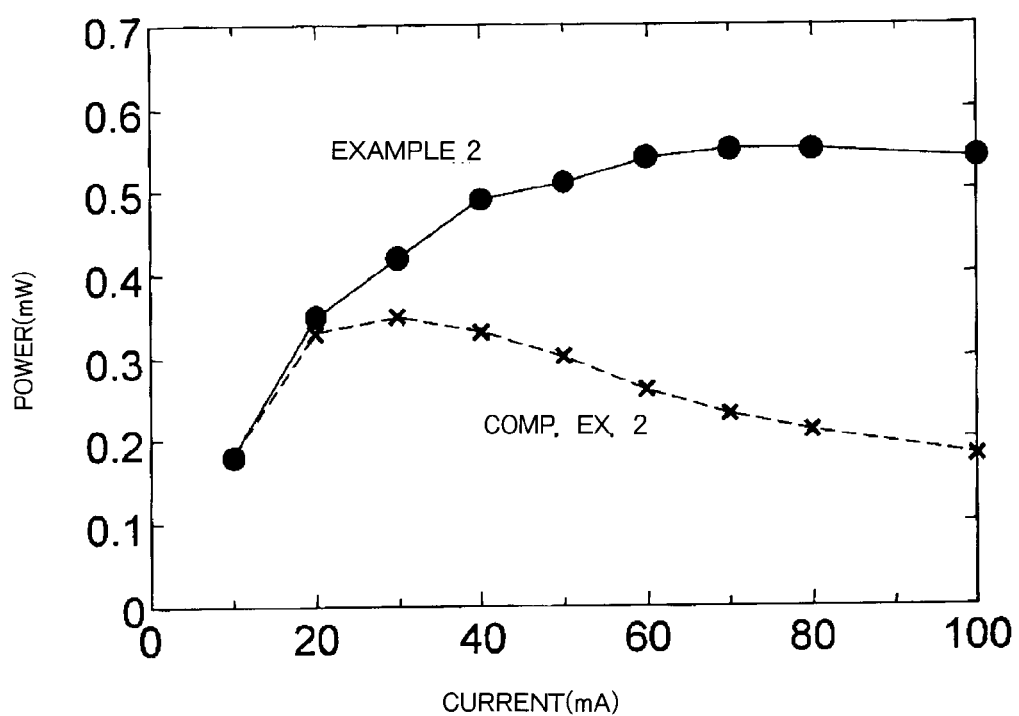
F I G. 5

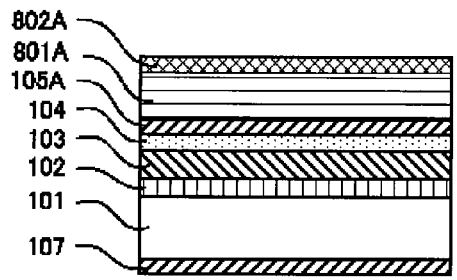
F I G. 8A
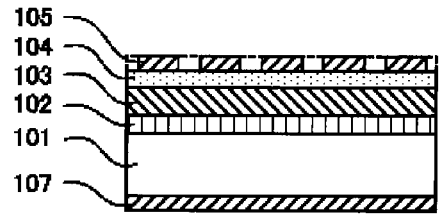
F I G. 8E
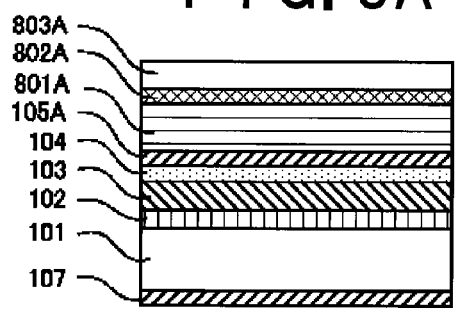
F I G. 8B
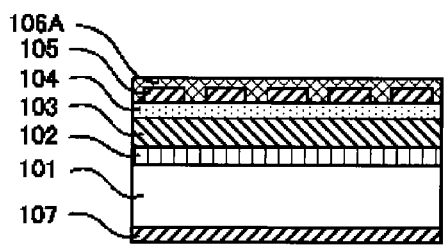
F I G. 8F
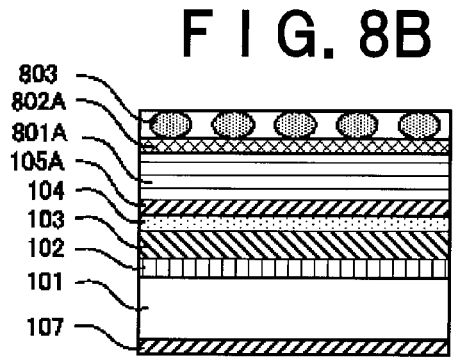
F I G. 8C
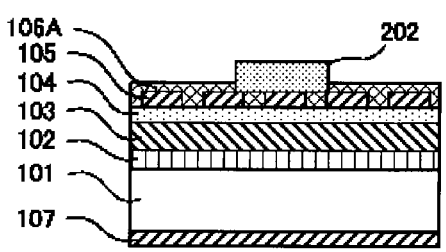
F I G. 8G
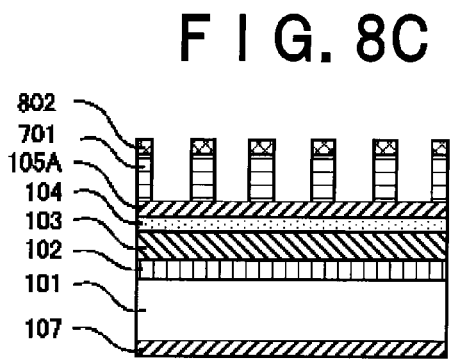
F I G. 8D

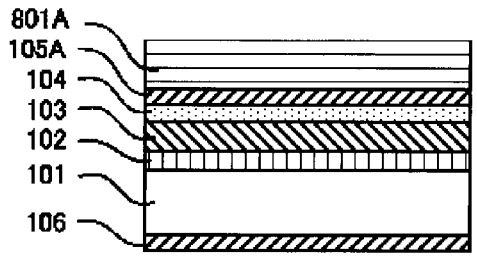
F I G. 10A
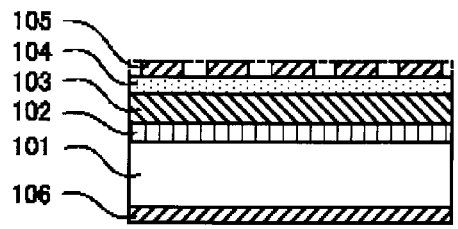
F I G. 10E
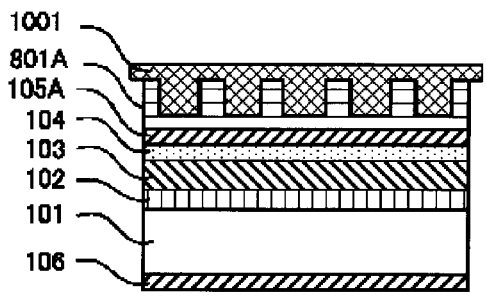
F I G. 10B
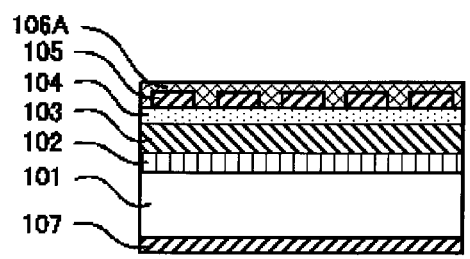
F I G. 10F
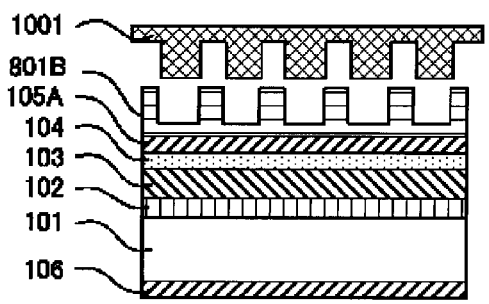
F I G. 10C
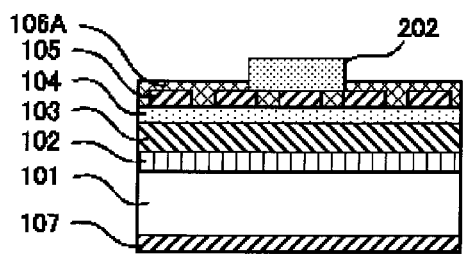
F I G. 10G
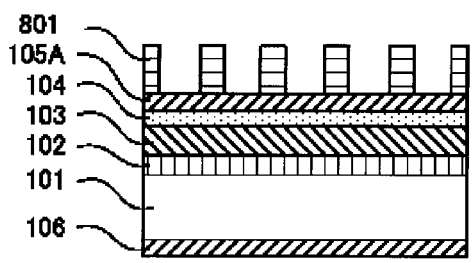
F I G. 10D

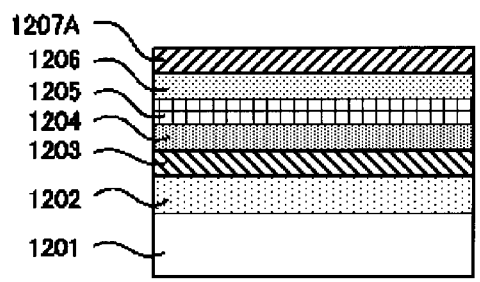
F I G. 12A
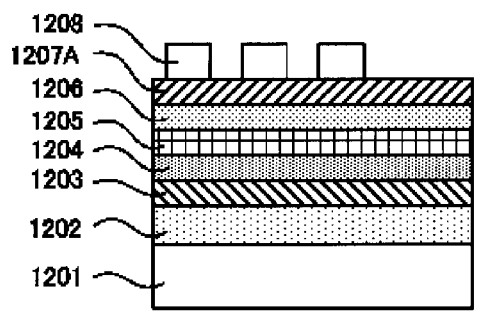
F I G. 12B
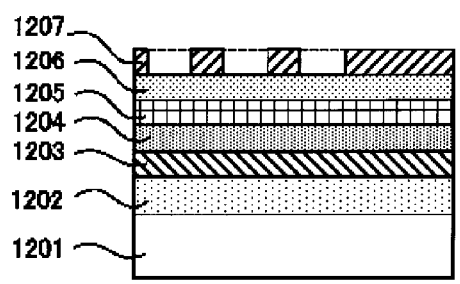
F I G. 12C
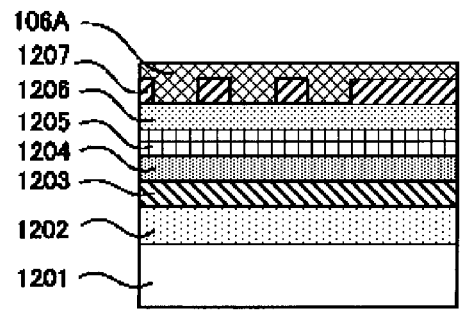
F I G. 12D
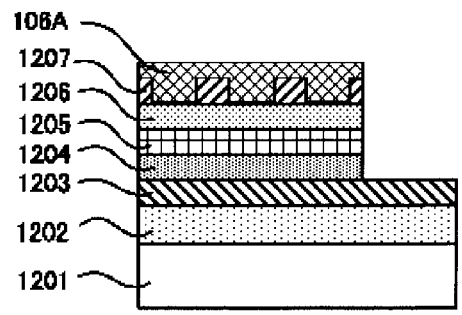
F I G. 12E
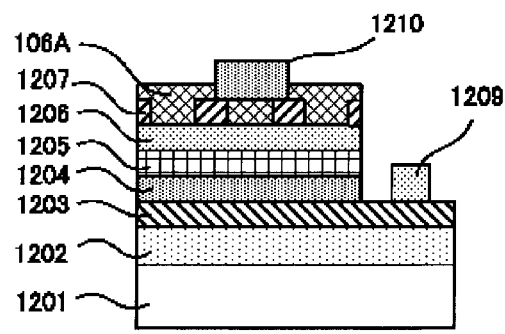
F I G. 12F

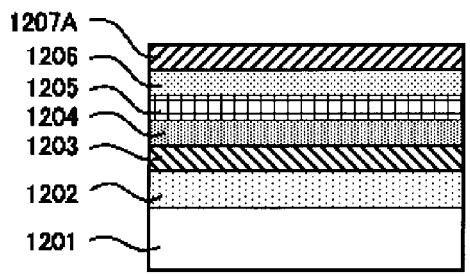
F I G. 13A
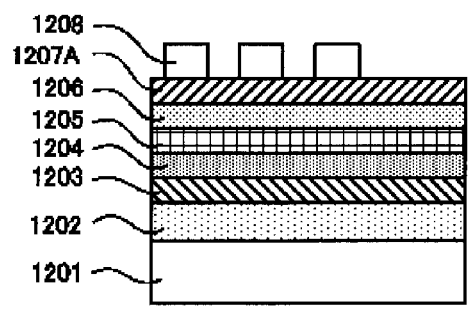
F I G. 13B
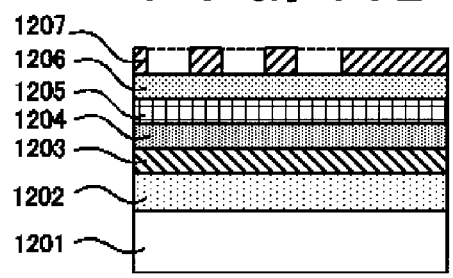
F I G. 13C
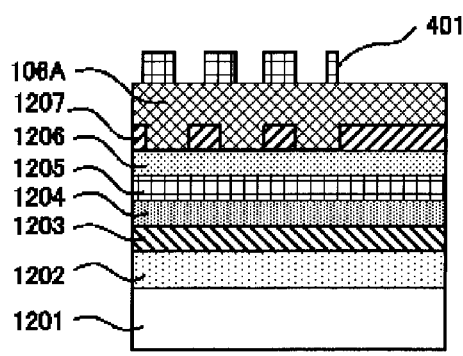
F I G. 13D
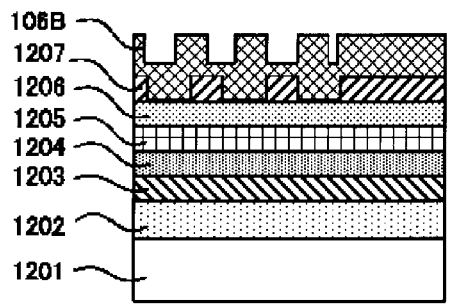
F I G. 13E
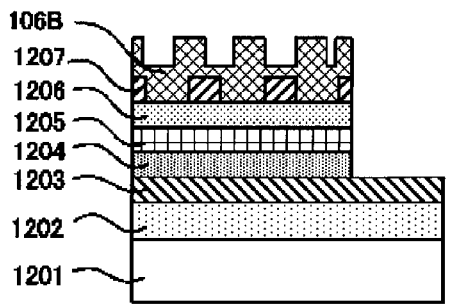
F I G. 13F
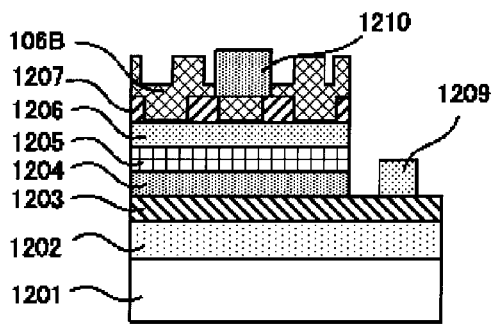
F I G. 13G

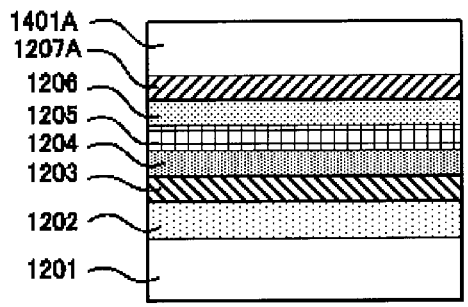
F I G. 15A
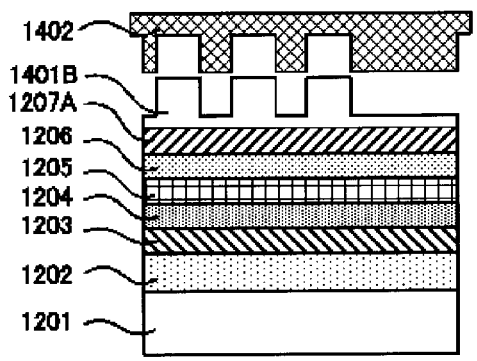
F I G. 15B
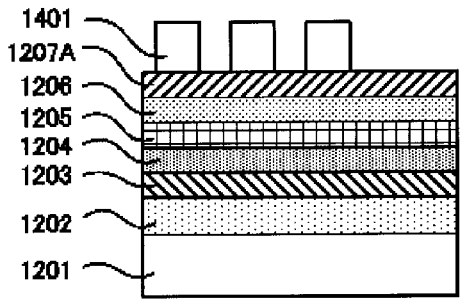
F I G. 15C
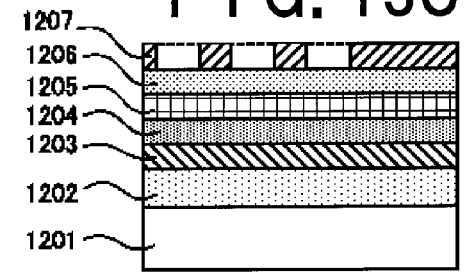
F I G. 15D
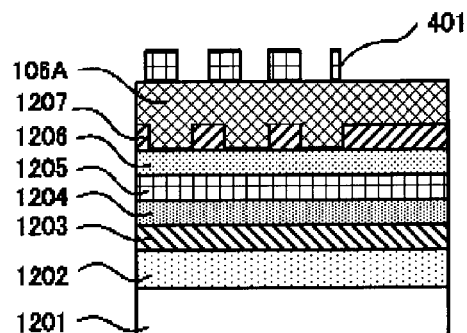
F I G. 15E
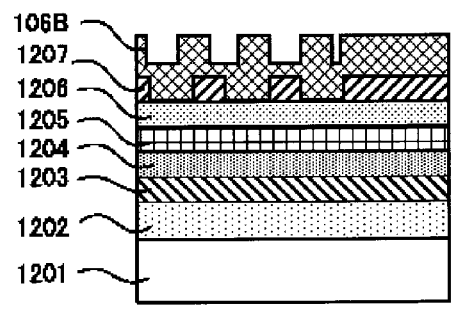
F I G. 15F
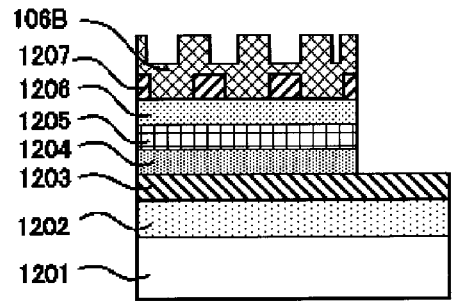
F I G. 15G
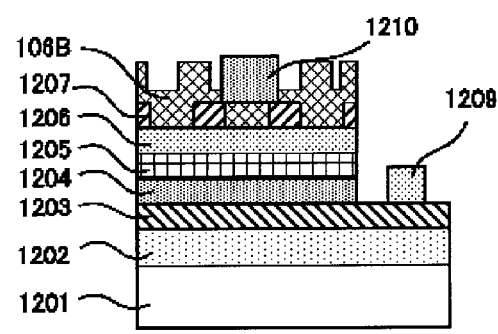
F I G. 15H

SEMICONDUCTOR LIGHT-EMITTING DEVICE AND LIGHTING INSTRUMENT EMPLOYING THE SAME

CROSS REFERENCE TO RELATED APPLICATIONS

This application is based upon and claims the benefit of priority from the prior Japanese Patent Application No. 2010-52809, filed on Mar. 10, 2010; the entire contents of which are incorporated herein by reference.

FIELD

The embodiment relates to a semiconductor light-emitting device having a metal electrode provided with openings.

BACKGROUND

Recently, semiconductor light-emitting devices have been studied for application to displays or to lighting instruments. The semiconductor light-emitting device generally includes electrodes and a semiconductor layer placed between them, and emits luminescence when current flows between the electrodes. Normally, the device has a pad electrode in ohmic contact with the semiconductor layer, and the luminescence is given off from the periphery of the pad electrode when the current flows. If used as a lighting instrument, the light-emitting device is preferred to be relatively large. However, enlarging the pad electrode is not effective in expanding the light-emitting part, and hence, practically a thin wire electrode is additionally put from the pad electrode along the semiconductor layer surface so that the light-emitting part can be expanded. On the other hand, if the thin wire electrode is extended, it generally causes a problem of making the electrode structure complicated.

From the viewpoint of application to lighting instruments, it can be also considered to supply an enough amount of current for the devices to enhance the luminance intensity. In a conventional semiconductor light-emitting device including the pad electrode, the luminance intensity increases according as the current increases until a certain value but then the intensity reaches the peak at the certain current value. Even if the current increases more than that value, the luminance intensity does not increase but decreases. A big reason of this is because large current flows in the device to generate too much heat to cool sufficiently. Accordingly, in order to enhance the luminance intensity of a conventional device, it is preferred to cool the device sufficiently. To cope with this problem, it is proposed to provide a heat-sinking substrate on the bottom of the device. However, that is not very effective at present because the substrate is positioned too far from the heated part.

BRIEF DESCRIPTION OF THE DRAWINGS

FIG. 1A schematically shows a sectional view of the semiconductor device according to a first embodiment.

FIG. 1B schematically shows a sectional view of the semiconductor device according to a second embodiment.

FIG. 1C is a plane view schematically illustrating the structure of the metal electrode.

FIGS. 2A to E conceptually illustrate a process for production of the semiconductor device in Example 1.

FIG. 3A shows a graph of voltage-current properties of the semiconductor devices.

FIG. 3B shows a graph of current-power properties of the semiconductor devices.

FIGS. 4A to G conceptually illustrate a process for production of the semiconductor device in Example 2.

FIG. 5 is a graph showing power-current properties of the semiconductor devices.

FIGS. 8A to G conceptually illustrate a process for production of the semiconductor device in Example 12.

FIGS. 10A to G conceptually illustrate a process for production of the semiconductor device in Example 14.

FIGS. 12A to F conceptually illustrate a process for production of the semiconductor device in Example 16.

FIGS. 13A to G conceptually illustrate a process for production of the semiconductor device in Example 17.

FIGS. 15A to H conceptually illustrate a process for production of the semiconductor device in Example 19.

DETAILED DESCRIPTION

Figure 6A:
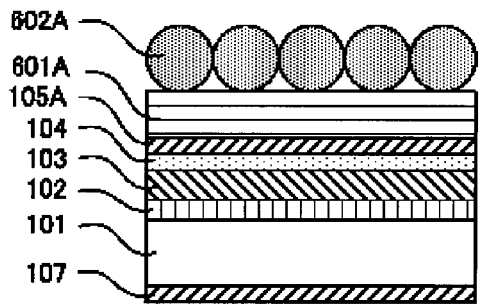
FIGS. 6A to H conceptually illustrate a process for production of the semiconductor device in Example 10.

A semiconductor light-emitting device according to the embodiment includes a substrate, a compound semiconductor layer, a metal electrode layer provided with particular openings, a light-extraction layer, and a counter electrode. The light-extraction layer has a thickness of not less than 20 nm but not more than 120 nm, and covers at least partly the metal part of the metal electrode layer; or otherwise the light-extraction layer has a fine rugged structure and covers at least partly the metal part of the metal electrode layer, and the rugged structure has projections so arranged that their summits are positioned at intervals of not less than 100 nm but not more than 600 nm and the heights of the summits from the surface of the metal electrode layer are not less than 200 nm but not more than 700 nm.

The embodiment is described below in detail.

A semiconductor light-emitting device according to a first embodiment, includes a substrate, a compound semiconductor layer formed on one surface of said substrate, a metal electrode layer which is formed on said compound semiconductor layer and whose thickness is not less than 10 nm but not more than 50 nm, a light-extraction layer formed on said metal electrode layer, and a counter electrode formed on the other surface of said substrate;

wherein said metal electrode layer includes a metal part so continuous that any pair of point-positions therein is continuously connected without breaks, and plural openings which penetrate through said metal electrode layer and whose circle-equivalent diameter is not less than 10 nm but less than 5 μm;

and said light-extraction layer covers at least partly the metal part of said metal electrode layer and has a thickness of not less than 20 nm but not more than 120 nm.

Further, a semiconductor light-emitting device according to a second embodiment, includes
a substrate,
a compound semiconductor layer formed on one surface of said substrate,
a metal electrode layer which is formed on said compound semiconductor layer and whose thickness is not less than 10 nm but not more than 50 nm,
a light-extraction layer which is formed on said metal electrode layer and which has a fine rugged structure, and
a counter electrode formed on the other surface of said substrate;
wherein
said metal electrode layer includes
a metal part so continuous that any pair of point-positions therein is continuously connected without breaks, and
plural openings which penetrate through said metal electrode layer and whose circle-equivalent diameter is not less than 10 nm but less than 5 μm;
and
said light-extraction layer covers at least partly the metal part of said metal electrode layer, and the rugged structure thereof has projections so arranged that their summits are positioned at intervals of not less than 100 nm but not more than 600 nm and the heights of the summits from the surface of said metal electrode layer are not less than 200 nm but not more than 700 nm.

Furthermore, a lighting instrument according to the embodiment including the above semiconductor light-emitting device.

Yet further, according to the embodiment, a process for production of either of the above semiconductor light-emitting devices, includes the steps of:
forming a compound semiconductor layer on a substrate,
forming a metal electrode layer on said compound semiconductor layer,
forming a light-extraction layer on said metal electrode layer, and
forming a counter electrode layer on said substrate on the side opposite to said compound semiconductor layer;
wherein
said step of forming a metal electrode layer further includes the sub-steps of:
forming a metal thin layer,
coating at least one part of said metal thin layer with a composition containing a block copolymer, to form a block copolymer film,
causing phase separation of said block copolymer to form microdomains in the form of a dot pattern, and
etching said metal thin layer by use of said dot-patterned microdomains as an etching mask, to form said metal electrode layer provided with openings.

Still further, according to the embodiment, another process for production of either of the above semiconductor light-emitting devices, includes the steps of:
forming a compound semiconductor layer on a substrate,
forming a metal electrode layer on said compound semiconductor layer,
forming a light-extraction layer on said metal electrode layer, and
forming a counter electrode layer on said substrate on the side opposite to said compound semiconductor layer;
wherein
said step of forming a metal electrode layer further includes the sub-steps of:
forming a metal thin layer,
preparing a stamper whose surface has a fine relief pattern corresponding to the shape of the metal electrode layer intended to be formed,
transferring a resist pattern onto at least one part of said metal thin layer by use of said stamper, and
forming openings on said metal thin layer by use of said resist pattern as an etching mask.

Embodiments will now be explained with reference to the accompanying drawings.

There is no particular restriction on material metal of the metal electrode layer according to the embodiment, as long as it has sufficient electro- and heat-conductivity. Accordingly, any metals generally used in electrodes can be adopted. However, in view of absorption loss, the metal electrode layer preferably contains Au or Ag as a base metal in an amount of, for example, 90 wt % or more. On the other hand, in view of ensuring ohmic contact and heat resistance, the metal electrode layer preferably also contains at least one metal selected from the group consisting of Al, Zn, Zr, Si, Ge, Pt, Rh, Ni, Pd, Cu, Sn, C, Mg, Cr, Te, Se and Ti.

The metal electrode layer of the semiconductor device according to the embodiment is provided with plural openings penetrating through the layer. Since the metal electrode layer can be made to occupy a relatively large area, it can have heat-dissipating ability high enough to prevent the device temperature from rising. In addition, it is also possible to prevent the temperature from rising by controlling the sizes and arrangement of the openings. Specifically, the sizes and arrangement of the openings can be so controlled that the forward voltage of the semiconductor light-emitting device may be lowered and thereby that the series resistance may be reduced so as to diminish the heat generation itself. In order to obtain this effect, it is preferred that the current flow evenly to the whole surface of the compound semiconductor layer from the metal electrode layer provided with the openings. Accordingly, it is necessary to control both the sizes of the openings and the center-to-center intervals among them so that the current may flow evenly in the whole compound semi-conductor layer. Researches based on calculation such as simulation indicate that the current flows in the area within approx. 5 μm from the edge of the metal electrode layer although it depends on the doping concentration of the semi-conductor layer, in which the current flows. Accordingly, if the openings have a circle-equivalent diameter larger than that, areas will appear where the current does not flow. Consequently in that case, the series resistance cannot be reduced and hence it is impossible to lower the forward voltage. In fact, as for semiconductor light-emitting devices including metal electrodes of net structure having 5 μm or more mesh, there is no report that the forward voltage is lowered (see, Jpn. J. Appl. Phys. Vol. 41 (2002) pp. L 1431-L 1433). The openings, therefore, have a circle-equivalent diameter of 5 μm or less, preferably 1 μm or less. On the other hand, there is no restriction on the lower limit of the diameter from the viewpoint of the resistance, but in view of production easiness the circle-equivalent diameter is generally 10 nm or more, preferably 30 nm or more. Here, the "circle-equivalent diameter" is derived from the area of each opening according to the formula of: $2 \times (\text{area}/n)^{1/2}$, and hence it corresponds to the mean diameter if all the openings are in the shape of circles.

The metal electrode layer in the embodiment includes a metal part, and the metal part is so continuous that any pair of point-positions therein is continuously connected without breaks. This is due to a keeping the resistance low, as described above.

The continuity of the metal part is also significant so that the device can emit luminescence from the whole compound semiconductor layer. The metal electrode layer has a sheet resistance of preferably 10Ω/☐ or less, more preferably 5Ω/☐ or less. The smaller the sheet resistance is, the less the device generates heat and hence the more remarkably the effect of the embodiment appears.

In general, a metal electrode is formed on the semiconductor layer by the steps of: forming a metal layer on the semiconductor layer, and then doping a dopant into the interface between the metal layer and the semiconductor layer via heat treatment to form ohmic contact. For example, in producing a normal red light-emitting device, the process for forming an electrode includes the steps of: forming a layered structure of Au/Au—Zn (dopant used in the p-layer) on a compound semiconductor layer of GaAs, GaP or the like, and then doping Zn into the metal-semiconductor interface to form ohmic contact. In the embodiment, a metal layer is formed in the same manner and subsequently openings are provided thereon in the manner described later, to form the metal electrode layer. If the metal electrode layer is too thin, the amount of the dopant is often too small to obtain sufficient doping. Consequently in that case, sufficient ohmic contact cannot be realized and accordingly the resistance increases. Our experiments reveal that the metal electrode layer must have a thickness of 10 nm or more, preferably 30 nm or more, so as to obtain sufficient ohmic contact. On the other hand, there is no restriction on the upper limit of the thickness from the viewpoint of the resistance, but in consideration of ensuring transmittance the thickness is preferably 50 nm or less.

Because of the metal electrode layer provided with the above fine openings, the semiconductor light-emitting device of the embodiment is excellent in electric properties and in thermal properties. However, since the light-emitting layer is covered with the metal layer of relatively low transmittance, it is difficult to fully extract light given off from the light-emitting layer. Accordingly, it is desired to increase the amount of light passing through the metal electrode layer.

For the purpose of increasing the amount of light passing through the electrode layer, it can be considered to form a light-extraction layer on the metal electrode layer. The light-extraction layer must be a dielectric or electroconductive film of high transmittance. Specifically, the light-extraction layer has a light-transmittance of preferably 50% or more, more preferably 60% or more at the wavelength of light given off from the light-emitting layer. If the light-extraction layer has a refractive index higher than the current spreading layer placed at the surface of the light-emitting layer, the reflection loss can be reduced. Accordingly, the light-extraction layer has a refractive index of not less than 1.8. Further, the semiconductor device is generally sealed with resin having a refractive index of about 1.5 at the final production step, and hence if having a refractive index lower than 1.5, the light-extraction layer often cannot give the improving effect. On the other hand, however, the refractive index is preferably not more than 2.5. If the refractive index is too large, the improving effect is also liable to be impaired when the device is sealed with resin having a refractive index of about 1.5. That is because there is too large difference in refractive index between the light-extraction layer and the sealing resin. In that case, it is often necessary to adjust the thickness of the light-extraction layer. Since the refractive indexes of available high-dielectric materials are up to about 2.5, it is practically difficult to use a material having a refractive index of more than 2.5. Examples of materials suitable for the light-extraction layer include SiN, SiON, $Ta_2O_5$, $TiO_2$, ZnS, $ZrO_2$, $Y_2O_3$, ITO, $Ce_2O_3$ and ZnO.

The light-extraction layer has a thickness of not less than 20 nm but not more than 120 nm. If the thickness is less than 20 nm, the improving effect often cannot be obtained. Further, if the thickness is inappropriate, the effect of lowering the reflection loss is liable to be reduced at the wavelength of the emission light. In view of that, the thickness is required to be not more than 120 nm. The light-extraction layer does not need to cover the whole metal electrode layer, and it may cover a part of the metal electrode layer. Specifically, the light-extraction layer increases the amount of light passing through the metal electrode layer by use of the difference in refractive index at the interface between the light-extraction layer and the metal electrode layer, and hence the effect can appear even if the light-extraction layer only partly covers the metal part of the metal electrode layer. Accordingly, even if the openings are not covered at all, the effect is scarcely changed. Unless particularly defined in the embodiment, the "thickness" of the light-extraction layer means a distance from the surface of the light-extraction layer to the surface of the compound semiconductor layer or to that of the contact layer. The compound semiconductor layer or the contact layer is in contact with the metal electrode layer. It should be noted that the thickness of the light-extraction layer is by no means a depth of the layer provided on the metal electrode layer. In other words, the thickness of the light-extraction layer is by no means a distance from the surface of the light-extraction layer to the surface of the metal electrode layer. Accordingly, in the embodiment, the thickness of the light-extraction layer is not smaller than that of the metal electrode layer.

For the purpose of increasing the amount of light passing through the metal electrode layer, a light-extraction layer having a fine rugged structure may be formed on the metal electrode layer. The fine rugged structure provides such anti-reflection and diffraction effects as can reduce the reflection loss at the interface between the metal electrode layer and the light-extraction layer, and consequently it enables to increase the amount of light passing through the metal electrode layer. In order to realize those effects, the rugged structure needs to include projections so arranged that their summits are positioned at intervals of not less than 100 nm but not more than 600 nm and the heights of the summits from the surface of the metal electrode layer must be not less than 200 nm but not more than 700 nm. However, there is no particular restriction on the level gap between the projections and the depressions in the rugged structure, but the gap is generally 200 to 700 nm, preferably 300 to 700 nm.

FIG. 1 shows sectional views illustrating the structures of semiconductor light-emitting devices according to the embodiment.

FIG. 1A illustrates a semiconductor light-emitting device 100A according to a first embodiment. The light-emitting device 100A includes, for example, a substrate 101 of n-type GaAs. On the substrate, for example, a hetero structure 102 including an n-type InAlP clad layer, an InGaP active layer and a p-type InAlP clad layer is formed. Further, a current-spreading layer 103 of, for example, p-type InGaAlP is provided thereon. These compound semiconductor sub-layers by no means restrict the constitution of the compound semiconductor layer, and the compound semiconductor layer may have any constitution according to necessity. The whole current-spreading layer is covered with a p-side metal electrode layer of Au/Au—Zn provided with openings, and a thin GaAs contact layer 104 is formed between the current-spreading layer and the metal electrode layer so that they can keep in ohmic contact with each other. Particularly if the current-spreading layer includes various elements, for example, if the current-spreading layer includes three or more elements such as InGaAlP or AlGaAs, it is difficult without the contact layer to bring the current-spreading layer into sufficient ohmic contact with the metal electrode layer 105 formed thereon. The material of the contact layer depends on the materials of the adjacent layers, namely, the semiconductor of the semiconductor layer and the metal of the metal electrode layer, but normally GaAs or GaP is preferred. The metal electrode layer 105 is provided with plural openings penetrating through the layer. FIG. 1C is a plane view of the metal electrode layer 105. The electrode layer shown in FIG. 1C includes a continuous metal part 105X and openings 105Y formed therein. The openings shown in FIG. 1C have random sizes and are arranged at random, but they by no means restrict the embodiment. If necessary, the openings may have the same size and may be regularly arranged.

On the metal electrode layer 105 provided with the openings, a light-extraction layer 106A is formed. The light-extraction layer is, for example, a ZnS film (refractive index: 2.3) having a thickness of 20 to 70 nm. Since ZnS substantially does not absorb light in the wavelength range of about 400 nm or longer, it is transparent to non-UV light given off from the semiconductor device.

On the opposite surface of the substrate, an n-side counter electrode 107 of, for example, Au is formed. Luminescence emitted by the active layer is extracted from the whole surface of the current-spreading layer.

FIG. 1B is a section view schematically illustrating a semiconductor light-emitting device 100B according to a second embodiment. This semiconductor device is different in the shape of the light-extraction layer from that of the first embodiment. In the second embodiment, a ZnS film (refractive index: 2.3) having a thickness of 200 to 500 nm is formed on the metal electrode layer 105 provided with the openings, and is then partly removed to form a light-extraction layer. The light-extraction layer 106B thus formed has a fine rugged structure.

The above semiconductor light-emitting device may be produced by any method. However, the semiconductor device of the embodiment is characterized by the metal electrode layer and the light-extraction layer, and hence in the production process the metal electrode layer and the light-extraction layer of rugged structure are preferably formed in particular manners. On the other hand, however, the other parts such as the compound semiconductor layer, the counter electrode and the light-extraction layer of the first embodiment can be formed by any known methods in combination.

The fine openings can be formed on the metal electrode layer of the semiconductor light-emitting device according to the embodiment by, for example, the following processes (A) to (D)

(A) Process Employing Self-Assembling of Block Copolymer

The light-emitting device of the embodiment can be produced according to a process employing phase separation of block copolymer caused by self-assembling. This process includes the steps of:

forming a compound semiconductor layer on a substrate,
forming a metal electrode layer on a light-extraction side of the compound semiconductor layer, and
forming a counter electrode layer on the substrate on the side opposite to the light extraction side;
wherein
the step of forming a metal electrode layer further includes the sub-steps of:
forming a metal thin layer,
coating at least one part of the metal thin layer with a composition containing a block copolymer, to form a block copolymer layer,
causing phase separation of the block copolymer to form microdomains in the form of a dot pattern, and
etching the metal thin layer by use of the dot-patterned microdomains as an etching mask, to form a light-extraction side metal electrode layer provided with openings.

This process is explained below more in detail. First, a compound semiconductor layer is formed on a substrate. Subsequently, on the substrate surface opposite to the compound semiconductor layer, metals such as Au/Zn are vacuum-deposited to form a counter electrode layer. The substrate, the compound semiconductor layer and the counter electrode layer can be made of any known materials, and can be formed by any known methods. For example, they may be made of the same materials as described above with reference to FIG. 1. Thereafter, metals such as Au/Zn are vacuum-deposited on the compound semiconductor layer to form a thin metal layer, and then a resist composition is coated and heated on the thin metal layer to form a resist layer.

If necessary, an organic polymer layer is further formed thereon by coating and thermosetting. The organic polymer layer is used for forming a mask for fabrication of the thin metal layer in the step described later. Since the mask is formed by lifting-off of the organic polymer layer, the height of the mask is determined by the thickness of the organic polymer layer. In view of that, the organic polymer layer preferably has a thickness of 50 to 400 nm.

On the organic polymer layer, a composition containing a block copolymer is spin-coated to form a block copolymer layer, which is then baked on a hot-plate to remove the solvent. The copolymer layer is then heat-treated to cause phase separation at a temperature of, for example, 150° C. to 250° C. The block copolymer includes, for example, polystyrene (hereinafter, referred to as "PS") block and polymethyl methacrylate (hereinafter, referred to as "PMMA") block, so as to form dotted PMMA domains in PS matrix.

The etching rates of PS and PMMA are very different from each other if gases are properly selected in a reactive ion etching (RIE) process. Accordingly, the phase separated PMMA dotted domains can be selectively removed by RIE to form voids, and thereby a mesh pattern of PS can be obtained.

The block copolymer is normally composed of typical polymer components incapable of withstanding the etching applied to the hard substrate, and hence the embodiment adopts a pattern-transfer method by use of an inorganic substance. First, the above voids are filled with an inorganic substance by coating or by physical vapor deposition. A part of the PS mesh pattern is then removed by RIE to obtain a dotted pattern of the inorganic substance.

Subsequently, the formed dotted pattern of inorganic substance is transferred by RIE onto the underlying organic polymer layer, to form a pillar pattern of the organic polymer layer. The pillar pattern of the organic polymer layer is then reversed by the lift-off method to form a mask of mesh pattern. The inorganic substance used in this step preferably has high etching selectivity to the organic polymer.

Finally, the mesh-patterned mask of inorganic substance is transferred by RIE or by ion milling onto the underlying thin metal layer, to form a metal electrode layer which is provided with openings and which keeps in ohmic contact with the compound semiconductor layer.

(B) Process Employing Nano-Imprinting

The light-emitting device of the embodiment can be also produced according a process employing nano-imprinting. This process includes the steps of:

forming a compound semiconductor layer on a substrate, forming a metal electrode layer on a light extraction side of the compound semiconductor layer, and forming a counter electrode layer on the substrate on the side opposite to the light extraction side;

wherein the step of forming a metal electrode layer further includes the sub-steps of:

forming a metal thin layer, preparing a stamper whose surface has a fine relief pattern corresponding to the shape of the metal electrode intended to be formed, transferring a resist pattern onto at least one part of the metal thin layer by use of the stamper, and forming openings on the metal thin layer by use of the resist pattern as an etching mask.

This process is explained below more in detail. First, a compound semiconductor layer is formed on a substrate. Subsequently, on the substrate surface opposite to the compound semiconductor layer, a counter electrode layer is formed. These layers can be formed in the same manner as described above.

Thereafter, metals such as Au/Zn are vacuum-deposited on the compound semiconductor layer to form a thin metal layer, and then a resist composition is coated and heated on the thin metal layer to form a resist layer.

Onto the resist layer, a fine relief pattern corresponding to the opening structure defined in the embodiment is transferred by use of a stamper as a mold.

The stamper can be produced by, for example, electron beam lithography applied to a quartz plate. The electron beam lithography can form a desired structure on the quartz plate, but this by no means restricts the embodiment. In the process for production of the light-emitting device according to the embodiment, there is no particular restriction on the materials and micro-fabrication of the stamper. For example, it is possible to prepare the stamper by the above method employing self-assembling of block copolymer or by the later-described method employing fine particles as a mask.

The stamper is put onto the resist layer, if necessary, while the resist layer is heated, and then cooled and released therefrom, so that an intaglio pattern in reverse to the relief pattern of the stamper is transferred on the resist layer. In this way, a resist pattern having pillars and openings among them is obtained.

The embodiment is not restricted to the thermal nano-imprinting process described above. Various imprinting techniques such as photo imprint and soft imprint can be used to form the above pattern, and they by no means impair the functions of the light-emitting device according to the embodiment.

The thin metal layer is etched by use of the obtained resist pattern as a mask, to bore openings through the thin metal layer. Finally, the resist pattern mask is removed to obtain a semiconductor light-emitting device of the embodiment.

(C) Process Employing Fine Particles as a Mask

The light-emitting device of the embodiment can be still also produced according to a process employing a monoparticle layer of, for example, fine silica particles as a mask. This process includes the steps of:

forming a compound semiconductor layer on a substrate, forming a metal electrode layer on a light extraction side of the compound semiconductor layer, and forming a counter electrode layer on the substrate on the side opposite to the light extraction side;

wherein the step of forming a metal electrode layer further includes the sub-steps of:

forming a metal thin layer, coating at least one part of the metal thin layer with a resist composition, to form a resist layer, forming a monoparticle layer of fine particles on the surface of the resist layer, etching the resist layer by use of the monoparticle layer as a mask, to form a resist pattern, filling openings of the resist pattern with an inorganic substance, to form a reverse pattern mask, and forming openings in the metal thin layer by use of the reverse pattern mask as an etching mask.

This process is explained below more in detail. First, a compound semiconductor layer is formed on a substrate. Subsequently, on the substrate surface opposite to the compound semiconductor layer, a counter electrode layer is formed. These layers can be formed in the same manner as described above.

Thereafter, metals such as Au and Au/Zn are vacuum-deposited on the compound semiconductor layer to form a thin metal layer, and then a resist composition is coated on the thin metal layer to form a resist layer. The resist layer can be then surface-treated by a reactive ion etching (RIE) process, to make the surface of the resist layer hydrophilic. This surface treatment can improve wettability in coating a dispersion described below.

The resist layer thus formed on the substrate is then coated with a dispersion containing, for example, fine silica particles of 200 nm in size, and annealed and cooled, if necessary, to form a monoparticle layer of silica particles. The diameters and size distribution of the fine particles are properly selected according to the design of the openings.

The obtained monoparticle layer of silica particles is etched, so that the fine silica particles are etched to reduce their radii and to form gaps among the adjacent particles. This etching is carried out under such conditions that the underlying resist layer is hardly etched. In other words, only the silica particles are etched by use of etching rate difference between the particles and the resist layer, so as to form gaps among the adjacent particles.

Subsequently, the underlying thermosetting resist is etched by use of the remaining fine particles as a mask, to obtain a resist pattern. The obtained pattern includes pillars of high aspect ratio at the positions where the fine particles were previously placed in the early step.

The obtained pillar resist pattern is coated with a spin-on-glass (hereinafter, referred to as SOG) solution, followed by heating, so that the gaps among the pillars of the resist pattern are filled with SOG.

Thereafter, the remaining silica particles and excess SOG covering the resist pillar pattern are removed by etching, to form a resist pillar pattern including SOG 509 filling the gaps among the pillars.

The pillars of thermosetting resist are then removed by etching. As a result of this step, a SOG mask having a pattern structure in reverse to the above resist pillar pattern is formed on the metal thin layer.

After that, the metal thin layer is etched by use of the SOG mask to form a metal electrode layer provided with openings.

Finally, the SOG mask is removed to produce a semiconductor light-emitting device according to the embodiment.

(D) Process Employing Electron Beam Lithography

The metal electrode layer provided with openings can be yet also formed by a process employing electron beam lithography. This process for production of the light-emitting device according to the embodiment includes the steps of:

forming a compound semiconductor layer on a substrate, forming a metal electrode layer on a light extraction side of the compound semiconductor layer, and forming a counter electrode layer on the substrate on the side opposite to the light extraction side;

wherein the step of forming a metal electrode layer further includes the sub-steps of:

forming a metal thin layer, coating the metal thin layer with an electron beam resist, to form a resist layer, subjecting the resist layer to an electron beam lithographic process in which a pattern corresponding to the shape of the openings intended to be formed is drawn on the resist layer by the electron beams and then developed to form a resist pattern, and etching the metal thin layer by use of the resist pattern as a mask, to form openings in the layer.

The semiconductor light-emitting device according to the second embodiment includes a light-extraction layer having a particular fine rugged structure. The fine rugged structure can be formed by applying any of the (A) to (D) processes, which are described above as methods for boring openings in the metal electrode layer. Specifically, first a dielectric or electro-conductive film of high transmittance as a primitive light-extraction layer is formed relatively thickly, for example, in a thickness of 200 to 500 nm; and then the film is subjected to RIE by use of a pattern mask formed according to any of the (A) to (D) processes.

More specifically, for example, the semiconductor light-emitting device can be produced in the following manner. First, a compound semiconductor layer is formed on a substrate by a desired method, and then a metal thin layer of Au/Au—Zn (3%) is formed on the semiconductor layer by vapor-deposition. Subsequently, the layers are preferably annealed at 450° C. for 30 minutes so that the metal thin layer can keep in ohmic contact with the current-spreading layer. This anneal treatment gives good ohmic contact. The Au/Au—Zn layer is then coated with an electron beam resist, to form a resist layer of 300 nm thickness. The resist layer thus formed is subjected to an electron beam lithographic process by means of an electron beam lithographic system, and then developed to form a pattern mask on which desired arrangement of the openings is designed. After that, the Au/Au—Zn layer is etched through the pattern mask by means of an ion-milling machine to bore openings.

Thereafter, a light-extraction layer is formed by a process selected according to the structure of the desired semiconductor light-emitting device. In the case where a device of the first embodiment is to be formed, a ZnS film of 50 nm thickness is formed by vapor-deposition on the Au/Au—Zn layer provided with openings.

In the case where a device of the second embodiment is to be formed, first a ZnS film of 400 nm thickness is formed by vapor-deposition on the Au/Au—Zn layer provided with openings. The ZnS film is then coated with an electron beam resist, to form a resist layer of 300 nm thickness. The resist layer thus formed is subjected to an electron beam lithographic process by means of an electron beam lithographic system, and then developed to form a pattern mask corresponding to the desired rugged structure. After that, the ZnS film is etched through the pattern mask by means of RIE machine to form a light-extraction layer having a fine rugged structure.

Finally, a pad electrode for wire bonding is formed on a part of the metal electrode layer, to obtain a semiconductor light-emitting device according to the embodiment.

The embodiment is further explained in detail by the following examples, in which known semiconductor devices including conventional metal pad electrodes were compared in properties with devices including metal electrodes provided with openings according to the embodiment.

Example 1 and Comparative Example 1

In accordance with the aforementioned process, a semiconductor light-emitting device was produced. In Example 1, the device was made 300 μm square in size, which is the same as a conventional device, so that the device including a metal electrode provided with openings could be evaluated in properties comparatively with a conventional device.

As shown in FIG. 2A, a hetero structure 102 including an n-type InAlP clad layer, an InGaP active layer and a p-type InAlP clad layer was formed on an n-GaAs substrate 101. Further, a current-spreading layer 103 of four-elemental p-type InGaAlP was epitaxially grown thereon. On the current-spreading layer thus formed, a p-type GaAs contact layer 104 (thickness: 0.1 μm) was formed so as to ensure ohmic contact. On the opposite side of the substrate, an n-type counter electrode 107 was provided.

Subsequently, on the p-type GaAs contact layer, a metal thin layer 105A of Au (10 nm)/Au—Zn (3%) (thickness: 30 nm) was formed by vapor deposition. The formed layer was then annealed at 450° C. for 30 minutes in nitrogen gas atmosphere so as to be fully brought into ohmic contact with the p-type GaAs layer.

Thereafter, the metal thin layer was coated with an electron beam resist (FEP-301 [trademark], manufactured by Fujifilm Corporation) to form a resist layer of 300 nm thickness. The resist layer was then treated by use of an electron beam exposure system (acceleration voltage: 50 kV) equipped with a pattern generator, to form a hole pattern 201 in which the diameter and interval of openings were 100 nm and 200 nm, respectively (FIG. 2B).

After that, the metal thin layer was etched by means of an ion-milling machine for 90 seconds under the conditions that the acceleration voltage and the ion current were 500 V and 40 mA, respectively, to form a metal electrode layer 105 provided with openings. After the etching procedure, the resist was removed by oxygen ashing (FIG. 2C).

Subsequently, ZnS (refractive index: 2.3) was vapor-deposited to form an insulating film of 50 nm thickness (FIG. 2D).

Since ZnS was an insulator, the ZnS film was removed partly in the area where a pad electrode was to be formed. Finally, a pad electrode was formed there to obtain a semiconductor light-emitting device (FIG. 2E). The obtained device emitted luminescence at 635 nm.

Independently, a comparative semiconductor light-emitting device was produced (Comparative Example 1). In the comparative device, only a pad electrode was formed on the contact layer. Each produced device was diced to be 300 μm square in size, and was comparatively evaluated in properties in the form of a bare chip. The results are given in FIG. 3A, which shows a graph of voltage-current properties. FIG. 3A indicates that, because of the metal electrode provided with openings, the device of the embodiment exhibited a voltage lower than the conventional device at the same current. Further, FIG. 3B shows luminance properties in relation to current. As indicated in FIG. 3B, the light-extraction layer (ZnS film) improves the transmittance so that the metal electrode provided with openings showed brighter luminance. In addition, according as the current increased, the device of Comparative Example 1 greatly lost the luminance while the device including the light-extraction layer and the electrode provided with openings did not lose but kept the luminance. After all, the device according to the embodiment emitted much brighter luminescence than the conventional device at 100 mA.

That is because the heat-dissipating ability was improved by the metal electrode layer covering the whole emitting surface and also because the light-extraction layer improved the transmittance of the metal electrode layer.

Example 2

A semiconductor light-emitting device having the structure of n-GaAs/n-InAlP/InGaP/p-InAlP/p-InGaAlP/p-GaAs, which was similar to the device of Example 1, was prepared.

On the p-type GaAs contact layer, a metal thin layer 105A of Au (10 nm)/Au—Zn (3%) (thickness: 30 nm) was formed by vapor deposition (FIG. 4A) and thereafter annealed at 450° C. for 30 minutes in nitrogen gas atmosphere so as to be fully brought into ohmic contact with the contact layer.

After that, the metal thin layer was coated with an electron beam resist in the same manner as in Example 1, to form a resist layer of 300 nm thickness. The resist layer was then treated by use of an electron beam exposure system (acceleration voltage: 50 kV) equipped with a pattern generator, to form a hole pattern 201 in which the diameter and interval of openings were 100 nm and 200 nm, respectively (FIG. 4B).

Thereafter, the metal thin layer was etched by means of an ion-milling machine for 90 seconds under the conditions that the acceleration voltage and the ion current were 500 V and 40 mA, respectively, to form a metal electrode layer provided with openings. After the etching procedure, the resist was removed by oxygen ashing (FIG. 4C).

Subsequently, ZnS (refractive index: 2.3) was vapor-deposited to form an insulating film 106A of 400 nm thickness (FIG. 4D). On the ZnS film, an electron beam resist layer of 300 nm was formed in the above manner. The resist layer was then treated by use of an electron beam exposure system (acceleration voltage: 50 kV) equipped with a pattern generator, to form a dot pattern mask 401 in which the size and interval of dots were 200 nm and 300 nm, respectively (FIG. 4E).

Thereafter, the insulating film 106A was etched through the dot pattern mask 401 by means of RIE apparatus for 1 minute under the conditions of $Cl_2$/Ar=10/10 sccm, 5 mTorr and ICP/Bias=100/300 W. The remaining resist was then removed by $O_2$ asher. The etching procedure thus formed a light-extraction layer 106B, which was an insulating film provided with a rugged structure having projections of 200 nm in size, 300 nm in interval and 300 nm in height (FIG. 4F).

Since ZnS was an insulator, the ZnS film was removed partly in the area where a pad electrode was to be formed. Finally, a pad electrode 202 was formed there to obtain a semiconductor light-emitting device (FIG. 4G).

Independently, a comparative semiconductor light-emitting device was produced (Comparative Example 2). For producing the comparative device, the procedure of Example 2 was repeated except for providing only a pad electrode in place of the metal electrode layer and the light-extraction layer. Each produced device was comparatively evaluated in properties in the form of a bare chip. As a result, it found that, because of the metal electrode provided with openings and of the light-extraction layer of fine rugged structure, the device of the embodiment exhibited a voltage lower than that of the conventional device at the same current. FIG. 5 shows their luminance properties in relation to current. As indicated in FIG. 5, when the current was as low as a few tens of milliamperes, the device of Example 2 showed almost the same luminance as that of Comparative Example 2. However, according as the current increased, the device of Comparative Example 1 greatly lost the luminance while that of Example 2 did not lose but kept the luminance. Consequently, the device of Example 2 emitted much brighter luminescence than that of Comparative Example 2 at 100 mA.

That is because the heat-dissipating ability was improved by the metal electrode layer covering the whole emitting surface and because the light-extraction layer of fine rugged structure improved the transmittance of the metal electrode layer.

Example 3 and Comparative Example 3

A semiconductor light-emitting device was prepared. The device had the same structure as Example 1 but was 1 mm square in size, which was larger than a common semiconductor device.

Independently, a comparative semiconductor light-emitting device was produced (Comparative Example 3). For producing the comparative device, the procedure of Example 3 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 3 was 0.2 V smaller than that of the device of Comparative Example 3. Further, when the current was 500 mA, the device of Example 3 emitted 2.5 times brighter luminescence than that of Comparative Example 3.

Those results indicate that the semiconductor light-emitting device according to the embodiment, which included the metal electrode provided with openings and the particular light-extraction layer, advantageously served as a large chip semiconductor light-emitting device.

Example 4 and Comparative Example 4

A semiconductor light-emitting device was prepared. The device had the same structure as Example 2 but was 1 mm square in size, which was larger than a common semiconductor device.

Independently, a comparative semiconductor light-emitting device was produced (Comparative Example 4). For producing the comparative device, the procedure of Example 4 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 4 was 0.2 V smaller than that of the device of Comparative Example 4. Further, when the current was 500 mA, the device of Example 4 emitted 2.5 times brighter luminescence than that of Comparative Example 4.

Those results indicate that the semiconductor light-emitting device according to the embodiment, which included the metal electrode provided with openings and the particular light-extraction layer, advantageously served as a large chip semiconductor light-emitting device.

Example 5 and Comparative Example 5

The procedure of Example 3 was repeated except that a SiN film (refractive index: 2.0) of 60 nm thickness was formed by CVD method in place of the ZnS film as the insulating film, to prepare a semiconductor light-emitting device of 1 mm square in size.

Independently, a comparative semiconductor light-emitting device was produced (Comparative Example 5). For producing the comparative device, the procedure of Example 5 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 5 was 0.2 V smaller than that of the device of Comparative Example 5. Further, when the current was 500 mA, the device of Example 5 emitted 2.3 times brighter luminescence than that of Comparative Example 5. Thus, the effect was slightly reduced, so that the luminescence was less improved. This is presumed to be because the light-extraction layer had a refractive index lower than that in Example 3.

Example 6 and Comparative Example 6

The procedure of Example 3 was repeated except that an electroconductive ITO film (refractive index: 2.0) of 60 nm thickness was formed by sputtering in place of the insulating ZnS film, to prepare a semiconductor light-emitting device of 1 mm square in size. Since the ITO film was electroconductive, a pad electrode was directly formed thereon without removing any part of the ITO film.

Independently, a comparative semiconductor light-emitting device was produced (Comparative Example 6). For producing the comparative device, the procedure of Example 6 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 6 was 0.2 V smaller than that of the device of Comparative Example 6. Further, when the current was 500 mA, the device of Example 6 emitted 2.25 times brighter luminescence than that of Comparative Example 6.

Example 7 and Comparative Example 7

The procedure of Example 3 was repeated except that the openings were formed in the metal electrode layer by use of an i-ray resist in place of the electron beam resist, to prepare a semiconductor light-emitting device of 1 mm square in size. Specifically, the metal thin layer was coated with an i-ray resist (THMR-iP3650 [trademark], manufactured by TOKYO OHKA KOGYO CO., LTD.) to form a resist layer of 1 μm thickness, and then the resist layer was treated by use of an i-ray stepper exposure system to form a hole pattern in which the diameter and interval of openings were 500 nm and 1 μm, respectively. Thereafter, the procedure of Example 3 was repeated to produce a semiconductor light-emitting device.

Independently, a comparative semiconductor light-emitting device was produced (Comparative Example 7). For producing the comparative device, the procedure of Example 7 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 7 was 0.15 V smaller than that of the device of Comparative Example 7. Further, when the current was 500 mA, the device of Example 7 emitted 2.0 times brighter luminescence than that of Comparative Example 7.

Example 8 and Comparative Example 8

The procedure of Example 4 was repeated except that the openings were formed in the metal electrode layer by use of an i-ray resist in place of the electron beam resist, to prepare a semiconductor light-emitting device of 1 mm square in size. Specifically, the metal thin layer was coated with an i-ray resist (THMR-iP3650 [trademark], manufactured by TOKYO OHKA KOGYO CO., LTD.) to form a resist layer of 1 μm thickness, and then the resist layer was treated by use of an i-ray stepper exposure system, to form a hole pattern in which the diameter and interval of openings were 500 nm and 1 μm, respectively. Thereafter, the procedure of Example 4 was repeated to produce a semiconductor light-emitting device.

Independently, a comparative semiconductor light-emitting device was produced (Comparative Example 8). For producing the comparative device, the procedure of Example 8 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 8 was 0.15 V smaller than that of the device of Comparative Example 8. Further, when the current was 500 mA, the device of Example 8 emitted 1.9 times brighter luminescence than that of Comparative Example 8.

Example 9 and Comparative Example 9

The procedure of Example 7 was repeated except for forming a hole pattern in which the diameter and interval of openings were 1.5 μm and 2 μm, respectively, to prepare a semiconductor light-emitting device of 1 mm square in size.

Independently, a comparative semiconductor light-emitting device was produced (Comparative Example 9). For producing the comparative device, the procedure of Example 9 was repeated except for providing only a pad electrode connected to a thin wire in place of the metal electrode layer and the light-extraction layer. Each device was comparatively evaluated in properties in the form of a bare chip. As a result, when the current was 1 A, the forward voltage of the device of Example 9 was 0.1 V smaller than that of the device of Comparative Example 9. Further, when the current was 500 mA, the device of Example 9 emitted 1.7 times brighter luminescence than that of Comparative Example 9.

Those results indicate that the luminescence tends to be less improved if the diameter and interval of openings are increased. This is presumed to be due to change of the current spreading.

Example 10 and Comparative Example 10

A semiconductor light-emitting device having the structure of n-GaAs/n-InAlP/InGaP/p-InAlP/p-InGaAlP/p-GaAs, which was similar to the device of Example 1, was prepared. On the p-type GaAs layer (contact layer) 104, a metal thin layer 105A of Au (thickness: 10 nm)/Au—Zn (3%) (thickness: 30 nm) was formed by vapor deposition and thereafter annealed at 450° C. for 30 minutes in nitrogen gas atmosphere.

After that, the metal thin layer 105A was spin-coated at 2000 rpm for 30 seconds with a solution of resist (THMR-iP3250 [trademark], manufactured by TOKYO OHKA KOGYO CO., LTD.) diluted at 1:1 with ethyl lactate (EL), and then heated on a hot-plate at 110° C. for 90 seconds to evaporate the solvent. The resist was annealed at 250° C. in nitrogen gas atmosphere to be thermally hardened. The resist layer 601A thus formed had a thickness of 300 nm.

Independently, silica particles of 200 nm diameter were dispersed in ethyl lactate. The amount of the particles was adjusted to be 8 wt %. Subsequently, acrylic monomer was added to the mixture so that the volume ratio of silica particle:acrylic monomer might be 1:3, to obtain a dispersion. As the acrylic monomer, ethoxylated (6) trimethylolpropane triacrylate (hereinafter, referred to as "E6TPTA") was used. The obtained dispersion was then dropped onto the resist layer formed on the substrate, and spin-coated at 2000 rpm for 60 seconds. After the spin-coating procedure, the solvent was completely removed by baking at 110° C. for 60 seconds. The layer thus formed was then annealed to harden at 150° C. for 1 hour, to form a monoparticle layer in which the silica particles 602A were regularly arranged (FIG. 6A).

Figure 6B:
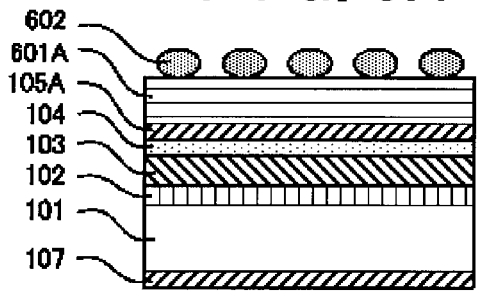

Thereafter, the silica particle layer was etched by means of reactive ion etching (RIE) apparatus for 2 minutes under the conditions of $CF_4$ flow: 30 sccm, pressure: 1.33 Pa (10 mTorr) and power: 100 W, and thereby the sizes of the silica particles were reduced to 150 nm (FIG. 6B) to form gaps among the particles.

Figure 6C:
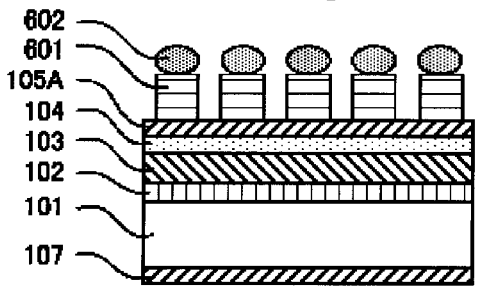

Subsequently, the resist layer was etched for 5 minutes by use of the silica particle layer as a mask under the conditions of $O_2$ flow: 30 sccm, pressure: 1.33 Pa (10 mTorr) and power: 100 W, to form a resist pillar pattern (FIG. 6C).

Figure 6D:
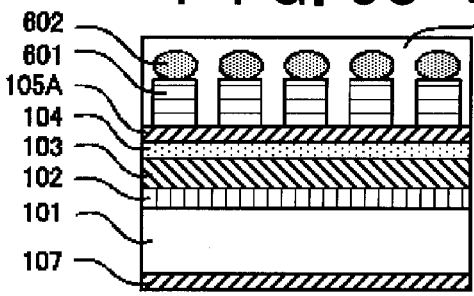

Onto the resist pillar pattern thus formed on the substrate, an organic SOG composition (OCD-T7 T-14000 [trademark], manufactured by TOKYO OHKA KOGYO CO., LTD.) was dropped and spin-coated at 2000 rpm for 60 seconds. After the spin-coating procedure, the solvent was completely removed by baking at 110° C. for 60 seconds. The layer thus formed was then annealed to harden at 250° C. for 1 hour, and thereby the resist pillar pattern was completely buried in the SOG layer 603A and the surface thereof was leveled (FIG. 6D).

Figure 6E:
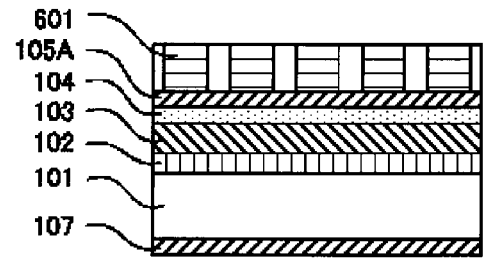

The leveled SOG layer was etched back for 10 minutes under the conditions of $CF_4$ flow: 30 sccm, pressure: 1.33 Pa (10 mTorr) and power: 100 W, to bare the top of the resist pillar pattern (FIG. 6E).

Figure 6F:
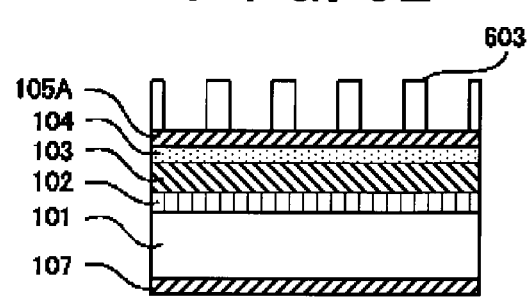

After that, the resist pillar pattern 601 was completely removed by etching for 3 minutes under the conditions of $O_2$ flow: 30 sccm, pressure: 1.33 Pa (10 mTorr) and power: 100 W, to form a hole pattern 603 of SOG (FIG. 6F).

Figure 6G:
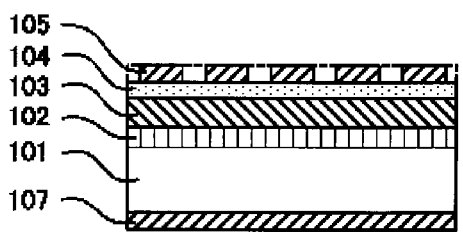

The metal thin layer 105A was then etched for 90 seconds by means of an ion-milling machine under the conditions that the acceleration voltage and the ion current were 500 V and 40 mA, respectively, to form a metal electrode layer 105 provided with openings. After the etching procedure, the SOG was removed by immersing in 5% hydrofluoric acid solution (FIG. 6G).

Subsequently, a ZnS film (refractive index: 2.3) 106A of 60 nm thickness was formed on the metal electrode layer 105 by vapor-deposition.

Figure 6H:
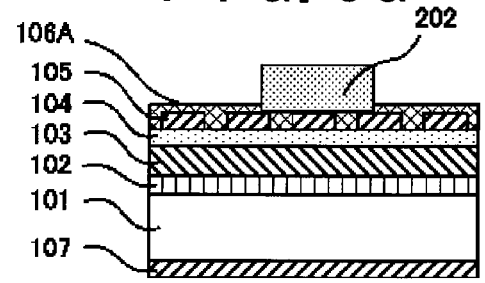

Finally, after the ZnS film was removed partly in the area where a pad electrode was to be formed, a pad electrode 202 was formed there to obtain a semiconductor light-emitting device (FIG. 6H).

Independently, a comparative semiconductor light-emitting device was produced (Comparative Example 10). For producing the comparative device, the procedure of Example 10 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 10 was 0.2 V smaller than that of the device of Comparative Example 10. Further, when the current was 500 mA, the device of Example 10 emitted 2.5 times brighter luminescence than that of Comparative Example 10.

Example 11 and Comparative Example 11

The procedure of Example 10 was repeated to form a metal electrode layer 105 on a compound semiconductor layer (FIG. 7A to G).

Figure 7A:
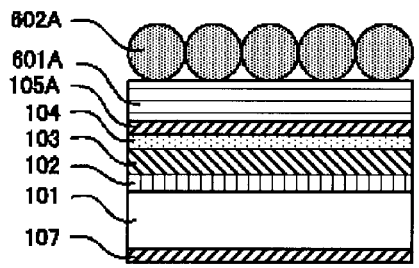
FIGS. 7A to J conceptually illustrate a process for production of the semiconductor device in Example 11.
Figure 7B:
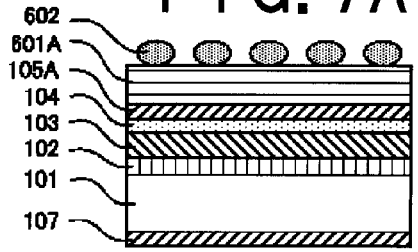
Figure 7C:
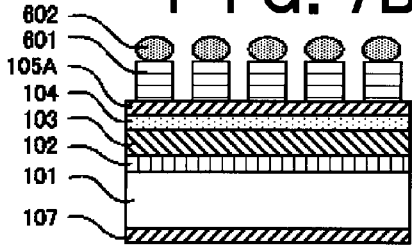
Figure 7D:
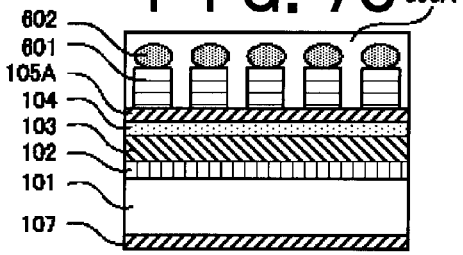
Figure 7E:
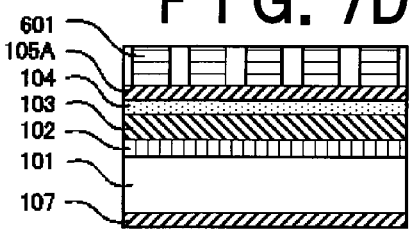
Figure 7F:
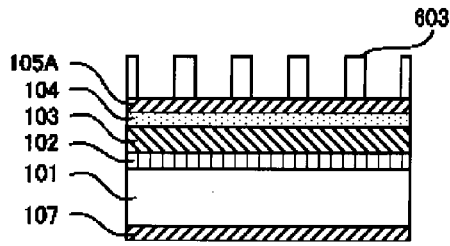
Figure 7G:
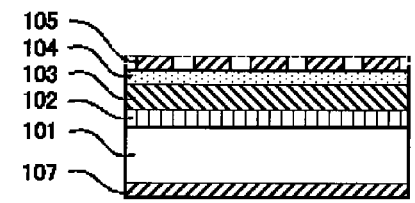
Figure 7H:
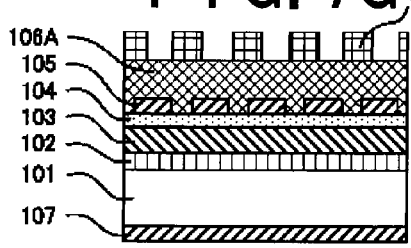

On the metal electrode layer 105, a ZnS film (refractive index: 2.3) 106A of 500 nm thickness was formed by vapor-deposition. On the formed ZnS film, an electron beam resist layer of 300 nm thickness was formed in the same manner as in Example 2. The resist layer was then treated by use of an electron beam exposure system (acceleration voltage: 50 kV) equipped with a pattern generator, to form a dot pattern 401 in which the size and interval of dots were 300 nm and 500 nm, respectively (FIG. 7H). Here, the "size" means a circle-equivalent diameter estimated from the cross-section area of the pattern viewed from above.

Figure 7I:
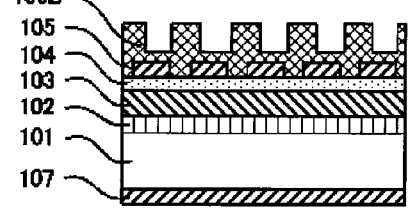
Figure 7J:
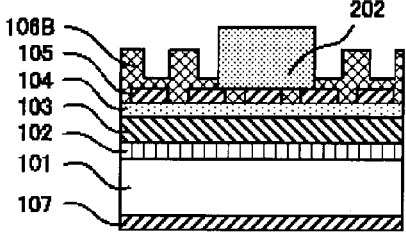

Subsequently, the ZnS film was etched by means of RIE apparatus for 1 minute under the conditions of $Cl_2$/Ar=10/10 sccm, 5 mTorr and ICP/Bias=100/300 W. The remaining resist was then removed by $O_2$ asher. The etching procedure thus formed a light-extraction layer 106B, which was a ZnS film provided with a rugged structure having projections of 300 nm in size, 500 nm in interval and 300 nm in height (FIG. 7I).

Finally, after the ZnS film was removed partly in the area where a pad electrode was to be formed, a pad electrode 202 was formed there to obtain a semiconductor light-emitting device (FIG. 7).

Independently, a comparative semiconductor light-emitting device was produced (Comparative Example 11). For producing the comparative device, the procedure of Example 11 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 11 was 0.2 V smaller than that of the device of Comparative Example 11. Further, when the current was 500 mA, the device of Example 11 emitted 2.4 times brighter luminescence than that of Comparative Example 11.

Example 12 and Comparative Example 12

A semiconductor light-emitting device having the structure of n-GaAs/n-InAlP/InGaP/p-InAlP/p-InGaAlP/p-GaAs, which was similar to the device of Example 1, was prepared. On the p-type GaAs layer 104, a layer 105A of Au (thickness: 10 nm)/Au—Zn (3%) (thickness: 10 nm) was formed by vapor deposition and thereafter annealed at 450° C. for 30 minutes in nitrogen gas atmosphere.

After that, the Au/Au—Zn layer 105A was spin-coated at 2000 rpm for 30 seconds with a solution of resist (THMR-iP3250 [trademark], manufactured by TOKYO OHKA KOGYO CO., LTD.) diluted at 1:3 with ethyl lactate (EL), and then heated on a hot-plate at 110° C. for 90 seconds to evaporate the solvent. The resist was annealed at 250° C. in nitrogen gas atmosphere to be thermally hardened. The resist layer 801A thus formed had a thickness of 100 nm.

Subsequently, the resist layer was spin-coated at 2000 rpm for 60 seconds with a solution of an organic SOG composition (OCD-T7 T-5500 [trademark], manufactured by TOKYO OHKA KOGYO CO., LTD.) diluted at 1:5 with ethyl lactate (EL). After the spin-coating procedure, the solvent was completely removed by baking at 110° C. for 60 seconds. The layer thus formed was then annealed to harden at 250° C. for 1 hour. The SOG layer 802A thus formed had a thickness of 30 nm (FIG. 8A).

The SOG layer was further spin-coated at 3000 rpm with a solution of block polymer containing 160000 molecular weight polystyrene (hereinafter, referred to as "PS") and 45000 molecular weight polymethyl methacrylate (hereinafter, referred to as "PMMA"), and then the solvent was removed by prebaking at 110° C. for 90 seconds to form a block copolymer layer 803A (FIG. 8B). Thereafter, the block copolymer layer was annealed at 210° C. for 4 hours in nitrogen gas atmosphere, so that the PS and PMMA were phase-separated to form a dot pattern 803 in which PMMA microdomains of 40 nm in size were arranged at intervals of 60 nm (FIG. 8C).

The block copolymer layer thus phase-separated was etched by RIE for 10 seconds under the conditions of $O_2$ flow: 30 sccm, pressure: 13.3 Pa (100 mTorr) and power: 100 W. Since the PS and PMMA had different etching rates, the PMMA was selectively etched to form a hole pattern of PS.

Thereafter, the underlying SOG layer was etched for 1 minute by use of the hole pattern of PS as a mask in RIE apparatus under the conditions of $CF_4$ flow: 30 sccm, pressure: 1.33 Pa (10 mTorr) and power: 100 W, to form a SOG hole pattern.

The resist layer was then etched by RIE for 60 seconds by use of the SOG hole pattern as a mask in RIE apparatus under the conditions of $O_2$ flow: 30 sccm, pressure: 1.33 Pa (10 mTorr) and power: 100 W, to form a resist hole mask (FIG. 8D).

Subsequently, the Au/Au—Zn layer was etched for 100 seconds by means of an ion-milling machine under the conditions that the acceleration voltage and the ion current were 500 V and 40 mA, respectively, to form a metal electrode layer 105 provided with openings (FIG. 8E).

After that, a ZnS film (refractive index: 2.3) 106A of 50 nm thickness was formed by vapor-deposition (FIG. 8F).

Finally, after the ZnS film was removed partly in the area where a pad electrode was to be formed, a pad electrode 202 was formed there to obtain a semiconductor light-emitting device (FIG. 8G).

Independently, a comparative semiconductor light-emitting device was produced (Comparative Example 12). For producing the comparative device, the procedure of Example 12 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 12 was 0.2 V smaller than that of the device of Comparative Example 12. Further, when the current was 500 mA, the device of Example 12 emitted 2.4 times brighter luminescence than that of Comparative Example 12.

Example 13 and Comparative Example 13

The procedure of Example 12 was repeated to form a metal electrode layer 105 on a compound semiconductor layer (FIG. 9A to E).

Figure 9A:
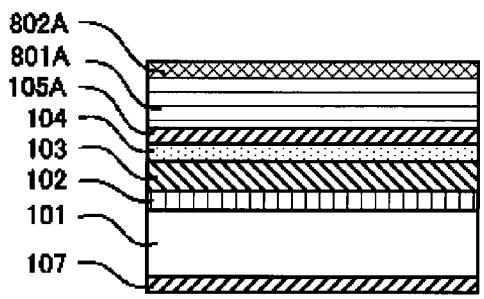
FIGS. 9A to H conceptually illustrate a process for production of the semiconductor device in Example 13.
Figure 9B:
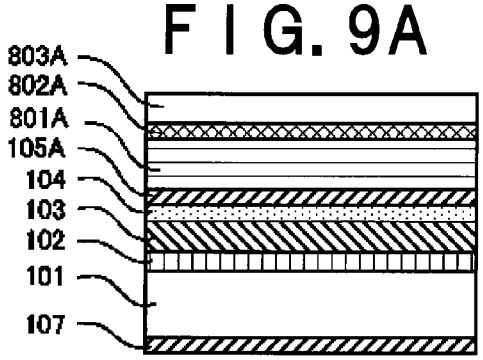
Figure 9C:
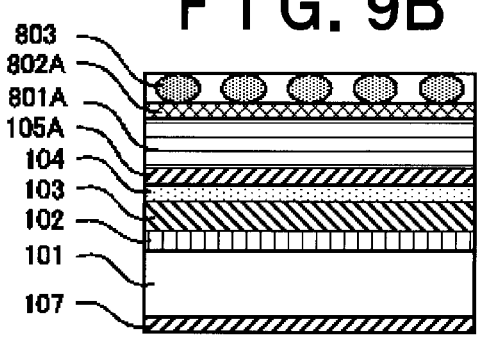
Figure 9D:
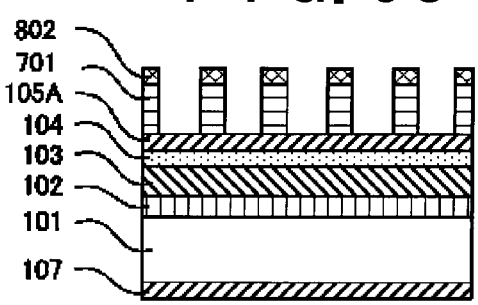
Figure 9E:
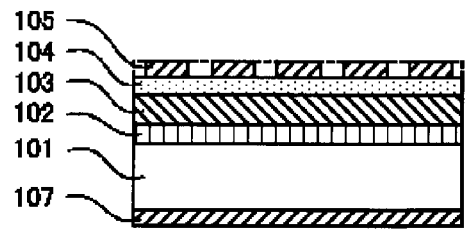
Figure 9F:
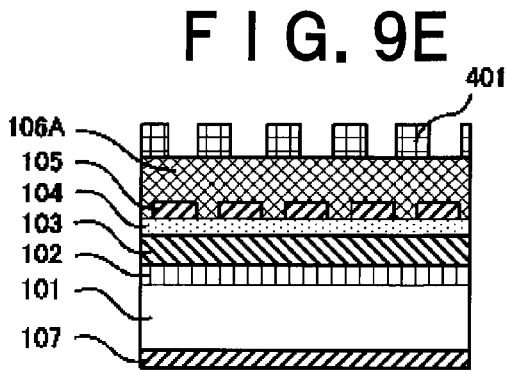

On the metal electrode layer 105, a ZnS film (refractive index: 2.3) 106A of 400 nm thickness was formed by vapor-deposition. On the formed ZnS film, an electron beam resist layer of 300 nm thickness was formed in the same manner as in Example 2. The resist layer was then treated by use of an electron beam exposure system (acceleration voltage: 50 kV) equipped with a pattern generator, to form a dot pattern 401 in which the size and interval of dots were 150 nm and 200 nm, respectively (FIG. 9F).

Figure 9G:
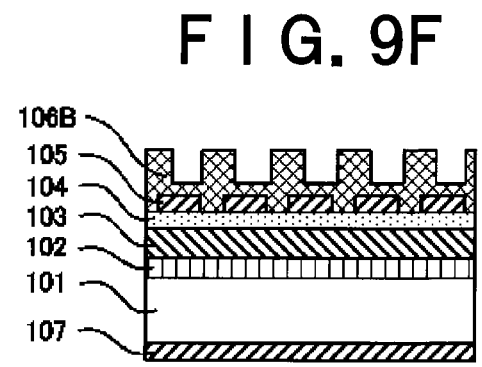

Subsequently, the ZnS film was etched by means of RIE apparatus for 90 seconds under the conditions of $Cl_2$/Ar=10/10 sccm, 5 mTorr and ICP/Bias=100/300 W. The remaining resist was then removed by $O_2$ asher. The etching procedure thus formed a light-extraction layer 106B, which was a ZnS film provided with a rugged structure having projections of 150 nm in size, 200 nm in interval and 400 nm in height (FIG. 9G).

Figure 9H:
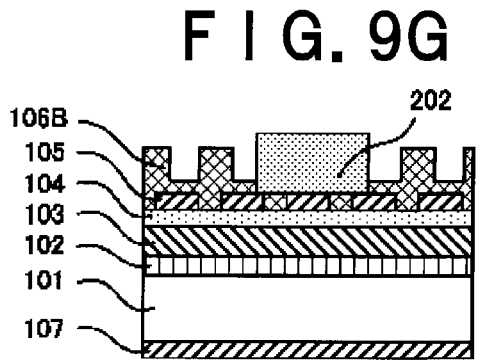

Finally, after the ZnS film was removed partly in the area where a pad electrode was to be formed, a pad electrode 202 was formed there to obtain a semiconductor light-emitting device (FIG. 9H).

Independently, a comparative semiconductor light-emitting device was produced (Comparative Example 13). For producing the comparative device, the procedure of Example 13 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 13 was 0.2 V smaller than that of the device of Comparative Example 13. Further, when the current was 500 mA, the device of Example 13 emitted 2.45 times brighter luminescence than that of Comparative Example 13.

Example 14 and Comparative Example 14

A semiconductor light-emitting device having the structure of n-GaAs/n-InAlP/InGaP/p-InAlP/p-InGaAlP/p-GaAs, which was similar to the device of Example 1, was prepared. On the p-type GaAs layer 104, a layer 105A of Au (thickness: 10 nm)/Au—Zn (3%) (thickness: 40 nm) was formed by vapor deposition and thereafter annealed at 450° C. for 30 minutes in nitrogen gas atmosphere.

After that, the Au/Au—Zn layer was spin-coated at 2000 rpm for 30 seconds with a solution of resist (THMR-iP3250 [trademark], manufactured by TOKYO OHKA KOGYO CO., LTD.) diluted at 1:2 with ethyl lactate (EL), and then heated on a hot-plate at 110° C. for 90 seconds to evaporate the solvent. The resist layer 801A thus formed had a thickness of 150 nm (FIG. 10A).

Independently, a quartz mold 1001 was prepared. On the quartz mold, a relief pattern was beforehand engraved (within an area of 9 cm$^2$) so that pillars of 200 nm in size and 150 nm in height were arranged at intervals of 300 nm. While the substrate provided with the resist layer formed thereon in the above manner was heated at 120° C., the quartz mold was placed on the resist layer so that the relief pattern might be in contact with the resist layer, and was then put onto the resist layer at a pressure of 10 MPa to perform imprinting (FIG. 10B). After the imprinting procedure, the substrate was cooled to room temperature and then the quartz mold was released from the resist layer. As a result of the imprinting procedure, an intaglio pattern 801B was formed on the resist pattern. In the formed pattern, holes of 200 nm in size and 100 nm in depth were arranged at intervals of 300 nm (FIG. 10C).

Subsequently, the intaglio resist pattern thus formed was etched for 30 seconds under the conditions of $O_2$ flow: 30 sccm, pressure: 10 mTorr and RF power: 100 W. After the $O_2$ RIE procedure, the bottoms of the holes in the resist layer were removed to bare the Au/Au—Zn layer 105A (FIG. 10D).

Thereafter, the Au/Au—Zn layer 105A was etched for 90 seconds by means of an ion-milling machine under the conditions that the acceleration voltage and the ion current were 500 V and 40 mA, respectively, to form a metal electrode layer 105 provided with openings. After the etching procedure, the resist was removed by oxygen ashing (FIG. 10E).

Subsequently, a SiN film (refractive index: 2.0) 106A of 60 nm thickness was formed by CVD method (FIG. 10F).

Finally, after the SiN film was removed partly in the area where a pad electrode was to be formed, a pad electrode 202 was formed there to obtain a semiconductor light-emitting device (FIG. 10G).

Independently, a comparative semiconductor light-emitting device was produced (Comparative Example 14). For producing the comparative device, the procedure of Example 14 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 14 was 0.2 V smaller than that of the device of Comparative Example 14. Further, when the current was 500 mA, the device of Example 14 emitted 2.3 times brighter luminescence than that of Comparative Example 14.

Example 15 and Comparative Example 15

The procedure of Example 14 was repeated to form a metal electrode layer 105 on a compound semiconductor layer (FIG. 11A to E).

Figure 11A:
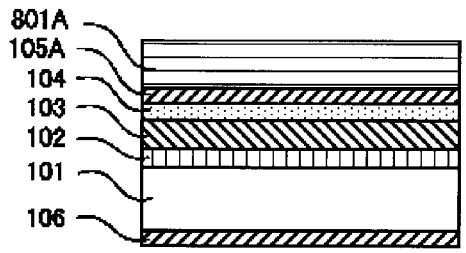
FIGS. 11A to H conceptually illustrate a process for production of the semiconductor device in Example 15.
Figure 11B:
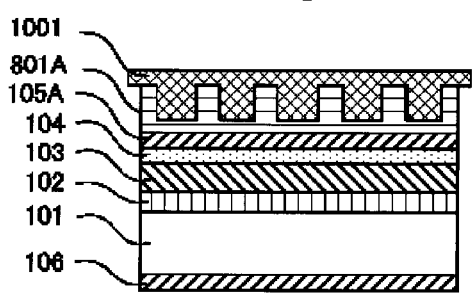
Figure 11C:
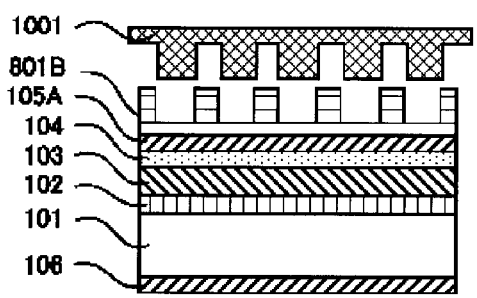
Figure 11D:
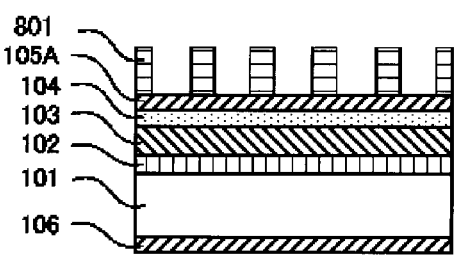
Figure 11E:
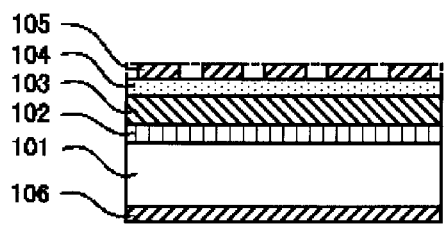
Figure 11F:
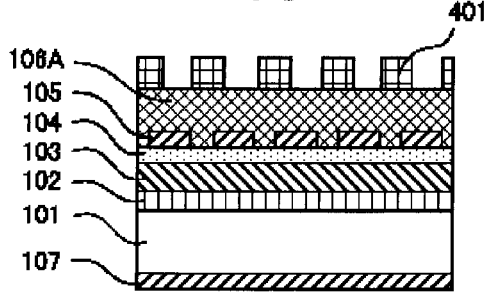

On the metal electrode layer 105, a SiN film (refractive index: 2.0) 106A of 500 nm thickness was formed by CVD method. On the formed SiN film, an electron beam resist layer of 300 nm thickness was formed in the same manner as in Example 2. The resist layer was then treated by use of an electron beam exposure system (acceleration voltage: 50 kV) equipped with a pattern generator, to form a dot pattern 401 in which the size and interval of dots were 200 nm and 300 nm, respectively (FIG. 11F).

Figure 11G:
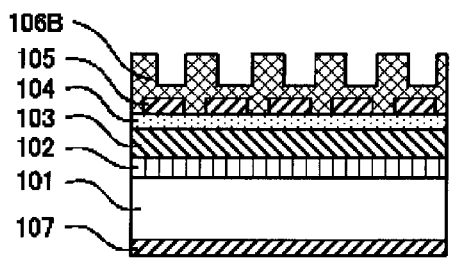

Subsequently, the SiN film was etched by means of RIE apparatus for 90 seconds under the conditions of $Cl_2$/Ar=10/10 sccm, 5 mTorr and ICP/Bias=100/300 W. The remaining resist was then removed by $O_2$ asher. The etching procedure thus formed a light-extraction layer 106B, which was a SiN film provided with a rugged structure having projections of 200 nm in size, 300 nm in interval and 400 nm in height (FIG. 11G).

Figure 11H:
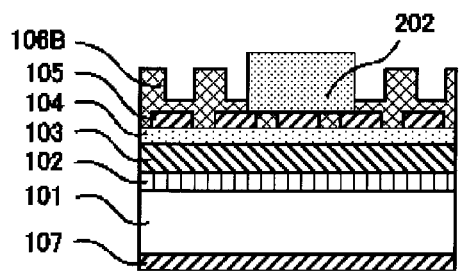

Finally, after the SiN film was removed partly in the area where a pad electrode was to be formed, a pad electrode 202 was formed there to obtain a semiconductor light-emitting device (FIG. 11H).

Independently, a comparative semiconductor light-emitting device was produced (Comparative Example 15). For producing the comparative device, the procedure of Example 15 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 15 was 0.2 V smaller than that of the device of Comparative Example 15. Further, when the current was 500 mA, the device of Example 15 emitted 2.3 times brighter luminescence than that of Comparative Example 15.

Example 16 and Comparative Example 16

A GaN buffer layer 1202 was formed on a sapphire substrate 1201. On the GaN buffer layer 1202, an n-GaN:Si layer 1203, a multi-quantum well (MQW) layer 1204 of INGaN/GaN, a p-$Al_{0.2}Ga_{0.8}$N:Mg layer 1205, and a p-GaN:Mg layer 1206 were epitaxially grown to be formed in order. After that, a layer 1207A of Ni (thickness: 10 nm)/Au (thickness: 40 nm) was formed on the p-GaN:Mg layer by vapor deposition, and then subjected to rapid high temperature annealing so as to ensure ohmic contact (FIG. 12A).

Thereafter, an electron beam resist layer was formed on the Ni/Au layer 1207A in the same manner as in Example 2, and treated by use of a pattern generator to form a hole pattern 1208 in which the diameter and interval of openings were 100 nm and 200 nm, respectively (FIG. 12B).

Subsequently, the Ni/Au layer was etched for 120 seconds by means of an ion-milling machine under the conditions that the acceleration voltage and the ion current were 500 V and 40 mA, respectively, to form a metal electrode layer 1207 provided with openings. After the etching procedure, the resist was removed by oxygen ashing (FIG. 12C).

On the metal electrode layer, a ZnS film (refractive index: 2.3) 106A of 60 nm thickness was then formed by vapor-deposition (FIG. 12D).

Thereafter, the n-GaN layer 1203 was partly bared by patterning so as to form a space for an n-type electrode on the n-GaN layer (FIG. 12E). Finally, an n-type electrode 1209 and a p-type pad electrode 1210 were formed to obtain a semiconductor light-emitting device (FIG. 12F). The obtained device emitted luminescence at 450 nm.

Independently, a comparative semiconductor light-emitting device was produced (Comparative Example 16). For producing the comparative device, the procedure of Example 16 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 16 was 0.25 V smaller than that of the device of Comparative Example 16. Further, when the current was 500 mA, the device of Example 16 emitted 1.8 times brighter luminescence than that of Comparative Example 16. Those results verified that a GaN type device having the structure according to the embodiment also gives the effect of the embodiment.

Example 17 and Comparative Example 17

The procedure of Example 16 was repeated to form a metal electrode layer 1207 on a compound semiconductor layer (FIG. 13A to C).

Subsequently, a ZnS film (refractive index: 2.3) 106A of 400 nm thickness was formed by vapor deposition. On the formed ZnS film, an electron beam resist layer of 300 nm thickness was formed in the same manner as in Example 2. The resist layer was then treated by use of an electron beam exposure system (acceleration voltage: 50 kV) equipped with a pattern generator, to form a dot pattern 401 in which the size and interval of dots were 200 nm and 300 nm, respectively (FIG. 13D).

The ZnS film was then etched by means of RIE apparatus for 1 minute under the conditions of $Cl_2/Ar=10/10$ sccm, 5 mTorr and ICP/Bias=100/300 W. The remaining resist was then removed by $O_2$ asher. The etching procedure thus formed a light-extraction layer 106B, which was a ZnS film provided with a rugged structure having projections of 200 nm in size, 300 nm in interval and 300 nm in height (FIG. 13E).

Thereafter, the n-GaN layer 1203 was partly bared by patterning so as to form a space for an n-type electrode on the n-GaN layer (FIG. 13G). Finally, an n-type electrode 1209 and a p-type pad electrode 1210 were formed to obtain a semi-conductor light-emitting device (FIG. 13H). The obtained device emitted luminescence at 450 nm.

Independently, a comparative semiconductor light-emitting device was produced (Comparative Example 17). For producing the comparative device, the procedure of Example 17 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 17 was 0.25 V smaller than that of the device of Comparative Example 17. Further, when the current was 500 mA, the device of Example 17 emitted 1.8 times brighter luminescence than that of Comparative Example 17. Those results verified that a GaN type device having the structure according to the embodiment also gives the effect of the embodiment.

Example 18 and Comparative Example 18

A semiconductor light-emitting device including a sapphire substrate/a GaN buffer layer/an n-GaN:Si layer/a MQW layer of InGaN/GaN/a p-$Al_{0.2}Ga_{0.8}$N:Mg layer/a p-GaN:Mg layer, which was similar to the device of Example 16, was prepared. After that, a Ni (thickness: 2 nm)/Ag (thickness: 30 nm) layer was vapor-deposited on the p-GaN:Mg layer to form a methal thin layer 1207A, which was then subjected to rapid high temperature annealing so as to ensure ohmic contact.

Figure 14A:
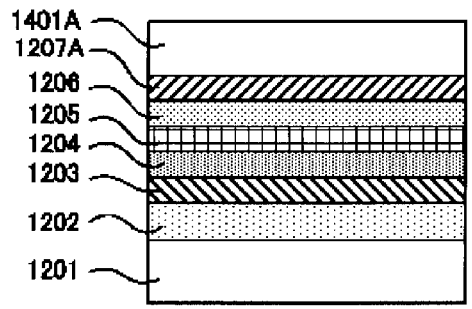
FIGS. 14A to G conceptually illustrate a process for production of the semiconductor device in Example 18.

After that, the Ni/Ag layer was spin-coated at 2000 rpm for 30 seconds with a solution of resist (THMR-iP3250 [trademark], manufactured by TOKYO OHKA KOGYO CO., LTD.) diluted at 1:2 with ethyl lactate (EL), and then heated on a hot-plate at 110° C. for 90 seconds to evaporate the solvent to form a resist layer 1401A, which had a thickness of 150 nm (FIG. 14A). Independently, a quartz mold 1402 was prepared. On the quartz mold, a relief pattern was beforehand engraved (within an area of 9 $cm^2$) so that pillars of 200 nm in size and 150 nm in height were arranged at intervals of 300 nm. While the substrate provided with the resist layer formed thereon in the above manner was heated at 120° C., the quartz mold was placed on the resist layer so that the relief pattern might be in contact with the resist layer, and was then put onto the resist layer at a pressure of 10 MPa to perform imprinting. After the imprinting procedure, the substrate was cooled to room temperature and then the quartz mold was released from the resist layer. As a result of the imprinting procedure, an intaglio pattern 1401B was formed on the resist pattern. In the formed pattern, holes of 200 nm in size and 100 nm in depth were arranged at intervals of 300 nm (FIG. 14B).

Subsequently, the intaglio resist pattern thus formed was etched for 30 seconds under the conditions of $O_2$ flow: 30 sccm, pressure: 10 mTorr and RF power: 100 W. After the $O_2$ RIE procedure, the bottoms of the holes in the resist layer were removed to bare the Ni/Ag layer 1207A (FIG. 14C).

Thereafter, the Ni/Ag layer was etched for 100 seconds by means of an ion-milling machine under the conditions that the acceleration voltage and the ion current were 500 V and 40 mA, respectively, to form a metal electrode layer 1207 provided with openings. After the etching procedure, the resist was removed by oxygen ashing (FIG. 14D).

Figure 14E:
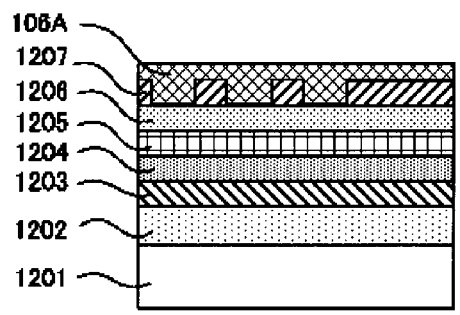
Figure 14B:
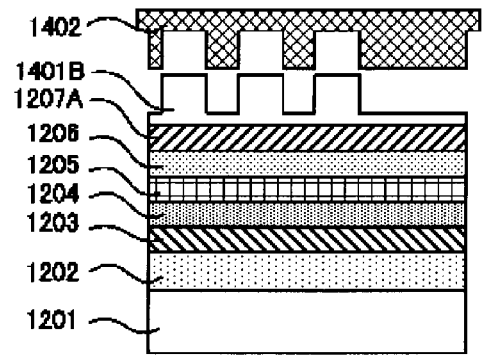

On the metal electrode layer, a SiN film (refractive index: 2.0) 106A of 80 nm thickness was formed by CVD method (FIG. 14E).

Figure 14F:
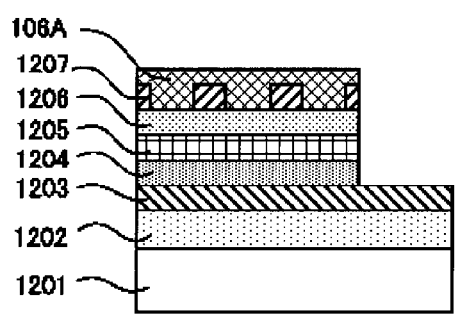
Figure 14C:
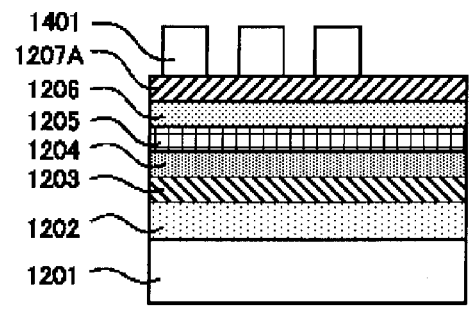
Figure 14G:
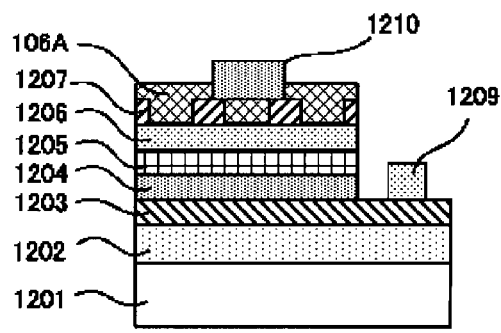
Figure 14D:
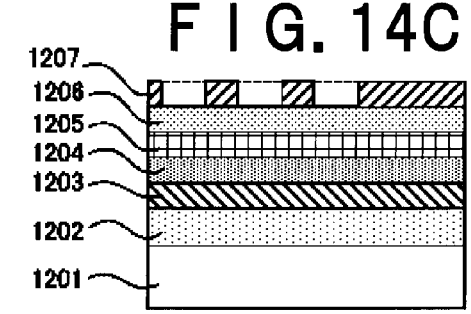

Thereafter, the n-GaN layer 1203 was partly bared by patterning so as to form a space for an n-type electrode on the n-GaN layer (FIG. 14F). Finally, an n-type electrode 1209 and a p-type pad electrode 1210 were formed to obtain a semiconductor light-emitting device (FIG. 14G).

Independently, a comparative semiconductor light-emitting device was produced (Comparative Example 18). For producing the comparative device, the procedure of Example 18 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 18 was 0.25 V smaller than that of the device of Comparative Example 18. Further, when the current was 500 mA, the device of Example 18 emitted 1.8 times brighter luminescence than that of Comparative Example 18.

Example 19 and Comparative Example 19

The procedure of Example 18 was repeated to form a metal electrode layer 1207 on a compound semiconductor layer (FIG. 15A to D).

Subsequently, a SiN film (refractive index: 2.0) 106A of 500 nm thickness was formed by CVD method. On the formed SiN film, an electron beam resist layer of 300 nm thickness was formed in the same manner as in Example 2. The resist layer was then treated by use of an electron beam exposure system (acceleration voltage: 50 kV) equipped with a pattern generator, to form a dot pattern 401 in which the size and interval of dots were 200 nm and 300 nm, respectively (FIG. 15E).

The SiN film was then etched by means of RIE apparatus for 90 seconds under the conditions of $Cl_2/Ar=10/10$ sccm, 5 mTorr and ICP/Bias=100/300 W. The remaining resist was then removed by $O_2$ asher. The etching procedure thus formed a light-extraction layer 106B, which was a SiN film provided with a rugged structure having projections of 200 nm in size, 300 nm in interval and 400 nm in height (FIG. 15F).

Thereafter, the n-GaN layer 1203 was partly bared by patterning so as to form a space for an n-type electrode on the n-GaN layer (FIG. 15G). Finally, an n-type electrode 1209 and a p-type pad electrode 1210 were formed to obtain a semiconductor light-emitting device (FIG. 15H).

Independently, a comparative semiconductor light-emitting device was produced (Comparative Example 19). For producing the comparative device, the procedure of Example 19 was repeated except for providing only a pad electrode connected to a thin wire in place of the metal electrode layer and the light-extraction layer. Each produced device was diced to be 1 mm square in size, and was comparatively evaluated in properties in the form of a bare chip. As a result, when the current was 1 A, the forward voltage of the device of Example 19 was 0.25 V smaller than that of the device of Comparative Example 19. Further, when the current was 500 mA, the device of Example 19 emitted 1.8 times brighter luminescence than that of Comparative Example 19.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the sprit of the inventions. The accompanying claims and their equivalents are intended to cover such forms or modifications as would fail within the scope and sprit of the invention.

The invention claimed is:

1. A semiconductor light-emitting device comprising:
   a substrate;
   a compound semiconductor layer formed on a first surface of said substrate;
   a metal electrode layer formed on said compound semiconductor layer, a thickness of said metal electrode layer being not less than 10 nm but not more than 50 nm, and said metal electrode layer comprising:
      a continuous metal part, any two point-positions in said continuous metal part being continuously connected without breaks; and
      a plurality of openings penetrating through said metal electrode layer and having a circle-equivalent diameter of not less than 10 nm but less than 5 μm;
   a light-extraction layer formed on said metal electrode layer and including a dielectric film, said light-extraction layer covering at least a portion of said continuous metal part and having a thickness of not less than 20 nm but not more than 120 nm; and
   a counter electrode formed on a second surface of said substrate.

2. The device according to claim 1, wherein said metal electrode layer mainly contains Ag or Au and further contains at least one element selected from the group consisting of Al, Zn, Zr, Si, Ge, Pt, Rh, Ni, Pd, Cu, Sn, C, Mg, Cr, Te, Se and Ti.

3. The device according to claim 1, wherein said light-extraction layer has a refractive index of not less than 1.8 but not more than 2.5.

4. The device according to claim 1, wherein said metal electrode layer occupies an area of 1 mm$^2$ or more.

5. The device according to claim 1, wherein said metal electrode layer keeps in ohmic contact with said compound semiconductor layer.

6. The device according to claim 1, wherein said metal electrode layer has a sheet resistance of 10Ω/□ or less.

7. The device according to claim 1, wherein said metal electrode layer has a light-transmittance of 10% or more at the wavelength of luminescence emitted from said compound semiconductor layer.

8. A lighting instrument comprising the semiconductor light-emitting device according to claim 1.

* * * * *